(12) United States Patent
Nishiwaki et al.

(10) Patent No.: US 6,930,353 B2
(45) Date of Patent: Aug. 16, 2005

(54) FIELD-EFFECT-TYPE SEMICONDUCTOR DEVICE

(75) Inventors: Katsuhiko Nishiwaki, Toyota (JP); Tomoyoshi Kushida, Seto (JP)

(73) Assignee: Toyota Jidosha Kabushiki Kaisha, Toyota (JP)

(*) Notice: Subject to any disclaimer, the term of this patent is extended or adjusted under 35 U.S.C. 154(b) by 7 days.

(21) Appl. No.: 10/694,947

(22) Filed: Oct. 29, 2003

(65) Prior Publication Data

US 2004/0084725 A1 May 6, 2004

(30) Foreign Application Priority Data

Nov. 10, 2002 (JP) ....................................... 2002-320222

(51) Int. Cl.[7] .............................................. H01L 29/76
(52) U.S. Cl. ........................ 257/330; 257/331; 257/341; 257/342
(58) Field of Search ................................ 257/330, 331, 257/341, 342

(56) References Cited

U.S. PATENT DOCUMENTS 6,803,628 B1 * 10/2004 Hamada ..................... 257/342

2004/0084725 A1 * 5/2004 Nishiwaki et al. .......... 257/342

FOREIGN PATENT DOCUMENTS

JP 2002-100770 4/2002

* cited by examiner

*Primary Examiner*—Mark V. Prenty
(74) *Attorney, Agent, or Firm*—Finnegan, Henderson, Farabow, Garrett & Dunner, LLP

(57) ABSTRACT

It is intended to provide a field-effective-type semiconductor device that can let low ON-resistance and non-excessive short-circuit current go together by effectively using its channel width and prevents device from destruction. In a field-effective-type semiconductor device, a semiconductor region arranged between gate electrodes 106 has stripe-patterned structure consisting of an $N^+$ emitter region 104 and a P emitter region. The P emitter region is constituted by P channel region 103 of low concentration and $P^+$ emitter region 100 of high concentration. The $N^+$ emitter region 104, the P channel region 103, and the $P^+$ emitter region 100 are in contact with the emitter electrode 109. Thereby, a channel width X is limited to the extent that is enough for ON current under normal operation state. That is, low ON-resistance and not excessive short-circuit current can go together in the field-effective-type semiconductor device.

20 Claims, 23 Drawing Sheets

FIELD-EFFECT-TYPE SEMICONDUCTOR DEVICE

BACKGROUND OF THE INVENTION

1. Field of the Invention

The present invention relates to a field-effect-type semiconductor device. More particularly, it relates to a field-effect-type semiconductor device of which short-circuit current is reduced without sacrificing ON-resistance.

2. Description of Related Art

There have conventionally been used field-effect-type semiconductor devices for power supply (e.g., an insulated gate-type bipolar transistor disclosed in Japanese Laid-Open Patent Publication No. 2002-100770). Some conventional field-effect-type semiconductor devices of this type apply ladder-type emitter structure aiming to reduce ON-resistance. FIG. 30 and FIG. 31 show an example of that. FIG. 31 is a sectional view of a portion B—B in FIG. 30. FIG. 30 is a sectional view of a portion A—A in FIG. 31. The sectional view of the portion C—C in FIG. 30 is substantially same as FIG. 3 of which numberings are changed from "1" to "9". This field-effect-type semiconductor device is so-called a trench-gate type. The field-effect-type semiconductor device is generally structured such that an emitter region and gate electrodes are arranged at a surface side of its semiconductor substrate (upper side in FIG. 31) and a collector region is arranged at the reverse side (lower side in FIG. 31 and FIG. 3).

That is, there are arranged trench-structured gate electrodes 906, a P+ emitter region 900, and an N+ emitter region 904 at the surface side of the semiconductor substrate. The gate electrodes 906 are insulated from the semiconductor substrate by a gate dielectric 905 and an interlayer dielectric 907. An emitter electrode 909 is arranged above the interlayer dielectric 907. The emitter electrode 909 is in contact with both the P+ emitter region 900 and the N+ emitter region 904. A P channel region 903 is arranged below those emitter regions. The bottom portion of the P channel region 903 is shallower than that of the gate electrodes 906.

An N drift region 902 is formed below the P channel region 903. Most part of the N drift region 902 is deeper than the bottom portion of the gate electrodes 906 and extends to almost entire plane of the semiconductor substrate. A P+ collector region 901 is arranged further below the N drift region 902. A collector electrode 910 is formed in contact with the bottom portion of the P+ collector region 901. In this field-effect-type semiconductor device, a range indicated with an arrow Y is a unit repeated in a vertical direction in FIG. 30.

In this field-effect-type semiconductor device, as shown in FIG. 30, the gate electrodes 906 and the N+ emitter region 904 are arranged alternately in vertically-striped pattern. The P+ emitter region 900 is insularly arranged with being surrounded by the N+ emitter region 904. Therefore, N+ emitter region 904 is arranged like a ladder pattern in FIG. 30. Furthermore, a width of the P+ emitter region 900 in FIG. 30 is narrower than a width 908 that is the width of a portion where the emitter electrode 909 is in contact with the P+ emitter region 900 and the N+ emitter region 904. A width 908 will be termed as a "contact aperture 908" hereinafter.

In this field-effect-type semiconductor device, current between the emitter electrode 909 and the collector electrode 910 is controlled by applying voltage to the gate electrodes 906. That is, conduction type around the surface of the P channel region 903 facing to side walls of the gate electrode 906 is reversed by voltage of the gate electrodes 906 thereby to form a current path. The N+ emitter region 904 is a ladder-patterned region. Therefore, when being inverted, a surface of the P channel region 903 becomes an effective channel with either a portion including the P+emitter region 900 (portion B—B in FIG. 30, i.e., a portion cross section of which is shown in FIG. 31) or a portion without P+ emitter region 900 (portion C—C in FIG. 30, i.e., a portion cross section of which is shown in FIG. 3). That is, the entirety of units Y repeated in a vertical direction (see FIG. 30) is a channel width. A channel width is thus taken as large as possible so as to reduce ON-resistance.

However, the above-described conventional field-effect-type semiconductor device has had the following problems.

A first problem is that short-circuit current is excessive. Such excessive short-circuit current is caused by the following mechanism: when short-circuiting occurs under ON state, large amount of electrons are supplied to the N drift region 902 from the N+ emitter region 904 through the N channel of the P channel region 903 and along with that, large amount of holes are supplied to the N drift region 902 from the P+ collector region 902. Short-circuit current under such situation is larger than ten-times of ON current under normal operation state. Therefore, a semiconductor device is heated to destroy with sudden overheating. On the other hand, from the viewpoint of normal operation state, ON current is less than one-tenth of short-circuit current. This means that only one-tenth or fewer amounts of electrons that can be supplied from the channel are actually used under normal operation state. Subsequently, the widened channel width does not work out efficiently. Accordingly, ON-resistance is not very low in fact.

A second problem is that latch-up phenomenon is likely to occur under OFF state. That is, since the N+ emitter region 904 is ladder patterned, a contact area of P-type region and the emitter electrode 909 (i.e., an area for a P+ emitter region 900 in FIG. 30) is small. Therefore, an escape path for holes in the P channel region 903 to escape to the emitter electrode 909 is narrow. Thereby, holes are likely to remain in the P channel region 903 after switching to OFF state, especially, after large current such as short-circuit current is turned off. This phenomenon is same as a situation such that base current flows into a parasitic bipolar transistor constituted by the N+ emitter region 904, the P channel region 903, and the N drift region 902. Therefore, a parasitic NPNP thyristor constituted by the N+ emitter region 904, the P channel region 903, the N drift region 902, and the N+ collector region 901 is turned on. As a result, latch-up phenomenon occurs. Current control is impossible under latch-up phenomenon occurring situation, whereby device is destroyed.

It is conceivable to constitute an emitter with only a P+ emitter region of which impurity concentration is high so as to avoid latch-up phenomenon. However, with such emitter structure, conduction type of the P+ emitter region cannot be reversed. Therefore the following problems are caused. Firstly, since supply of electrons to the N drift region 902 becomes inconstant, current flowing in device becomes unstable. This causes latch-up phenomenon in a high current region. Furthermore, since impurity concentration of the P+ emitter region is high, it is low resistance. Furthermore, the contact area of the P+ emitter region and the emitter electrode 909 is significantly large. Therefore, holes in the N drift region 902 escape to the emitter electrode 909 through the P+ emitter region. This causes shortage of holes in the N drift region 902 and results in high ON resistance.

SUMMARY OF THE INVENTION

The present invention has been made in order to solve the foregoing problem. It is an object of the present invention to provide a field-effective-type semiconductor device that can let low ON-resistance and non-excessive short-circuit current go together by effectively using its channel width and prevents device from destruction.

To resolve the conventional problem, there is provided a field-effect-type semiconductor device comprising: a channel region of a first conduction-type semiconductor; a first-conduction-type emitter region being in contact with the channel region, and being a first conduction-type semiconductor with higher concentration than that of the channel region; a gate electrode penetrating the channel region, and insulated from the channel region and the first-conduction-type emitter region; and an emitter electrode being in contact with the channel region and with the first-conduction-type emitter region.

In this field-effect-type semiconductor device, both the channel region and the first-conduction-type emitter region are in contact with the emitter electrode. That is, a part of a contact area of the emitter electrode is occupied by the channel region. Therefore, a contact area of the first-conduction-type emitter region and the emitter electrode is more limited than a field-effect-type semiconductor device in which the entirety of a contact area of an emitter electrode is occupied by a first-conduction-type emitter region. Such design of a contact area prevents first conduction-type carriers in the channel region from escaping to the emitter electrode through the contact portion of the first-conduction-type emitter region (low resistance) and the emitter electrode under an ON state. Therefore, concentration of the first conduction-type carriers in the channel region under an ON state is kept high. Accordingly, ON-resistance is low. On the other hand, some extent of contact area is secured for the entirety of the first conductive region, i.e., the first-conduction-type emitter region and the channel region. Therefore, the first conduction-type carriers can escape to the emitter electrode without problem after switch-off, especially, after large current such as short-circuit current is switched off.

The inventive field-effect-type semiconductor device preferable further comprises a second-conduction-type emitter region being insulated from the gate electrode, the second-conduction-type emitter region being a second conduction-type semiconductor, wherein the second-conduction-type emitter region is in contact with the channel region and the emitter electrode, and the gate electrode faces the second-conduction-type emitter region, the channel region and a contact portion of those regions.

In the above field-effect-type semiconductor device, a width of a contact portion of the second-conduction-type emitter region and the channel region facing the gate electrode works as a channel section under ON state. By adjusting width of the channel section, amount of short-circuit current can be set appropriately while ON-resistance is kept low. Furthermore, a conduct path of second conduction-type carriers can be secured thanks to the channel section. As a result, inconstancy of second conduction-type carries in device does not occur. This also contributes to lowering of ON-resistance and prevention of latch-up phenomenon.

The above and further objects and novel features of the invention will more fully appear from the following detailed description when the same is read n connection with the accompanying drawings. It is to be expressly understood, however, that the drawings are for the purpose of illustration only and are not intended as a definition of the limits of the invention.

DETAILED DESCRIPTION OF PREFERRED EMBODIMENTS

Embodiments of the present invention will be described by referring to drawings.

[First Embodiment]

Figure 1:
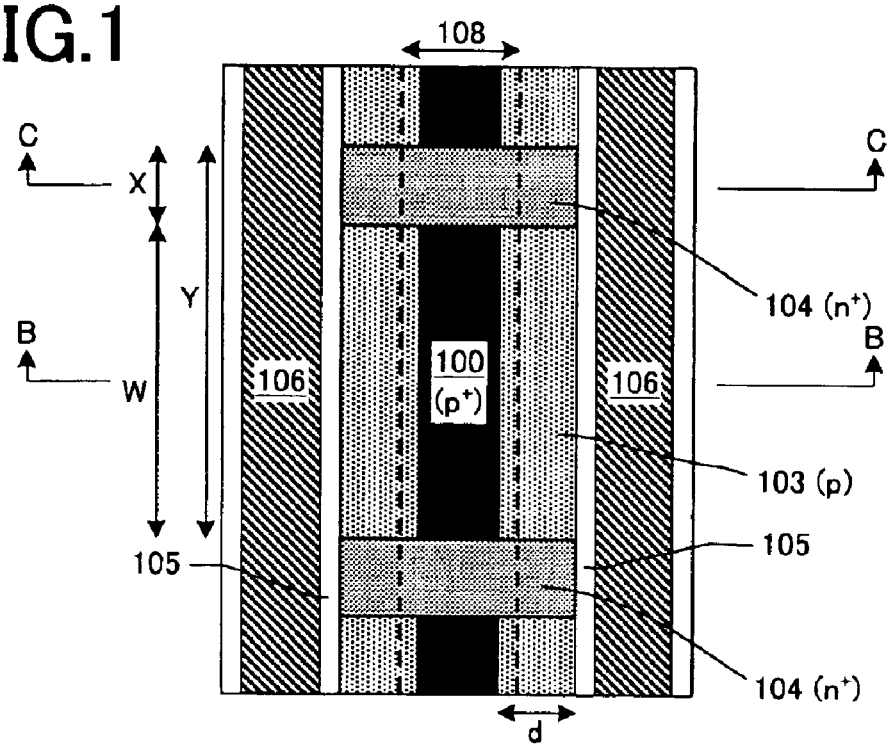
FIG. 1 is a plane sectional view (a portion A—A) showing structure of a field-effect-type semiconductor device directed to a first embodiment.
Figure 2:
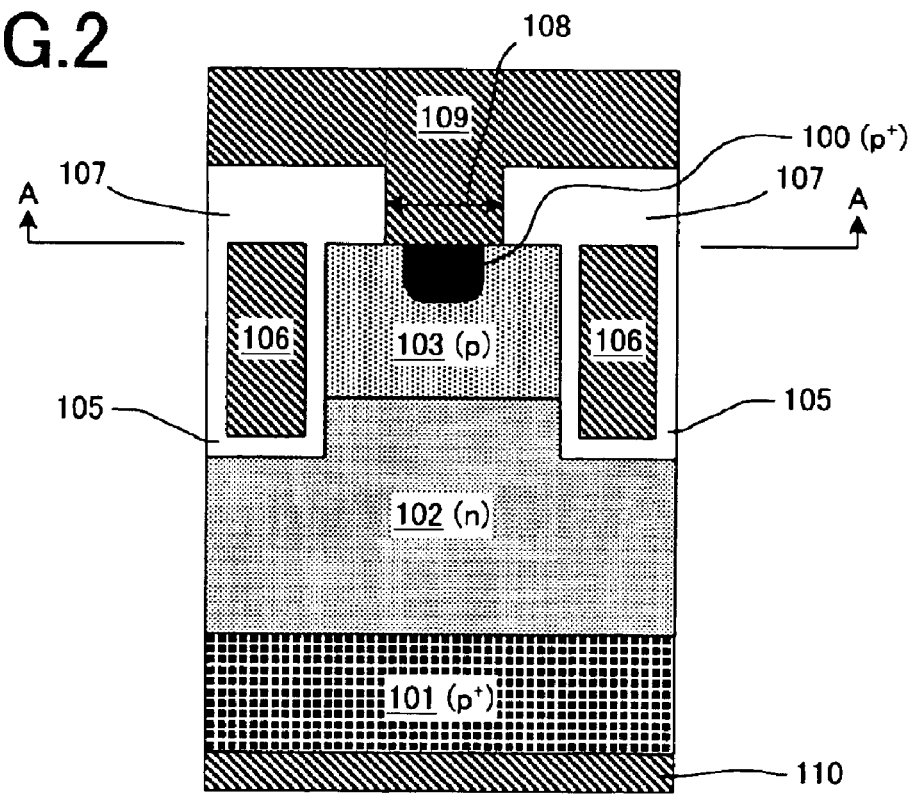
FIG. 2 is an elevation sectional view (a portion B—B) showing structure of the field-effect-type semiconductor device directed to the first embodiment.
Figure 3:
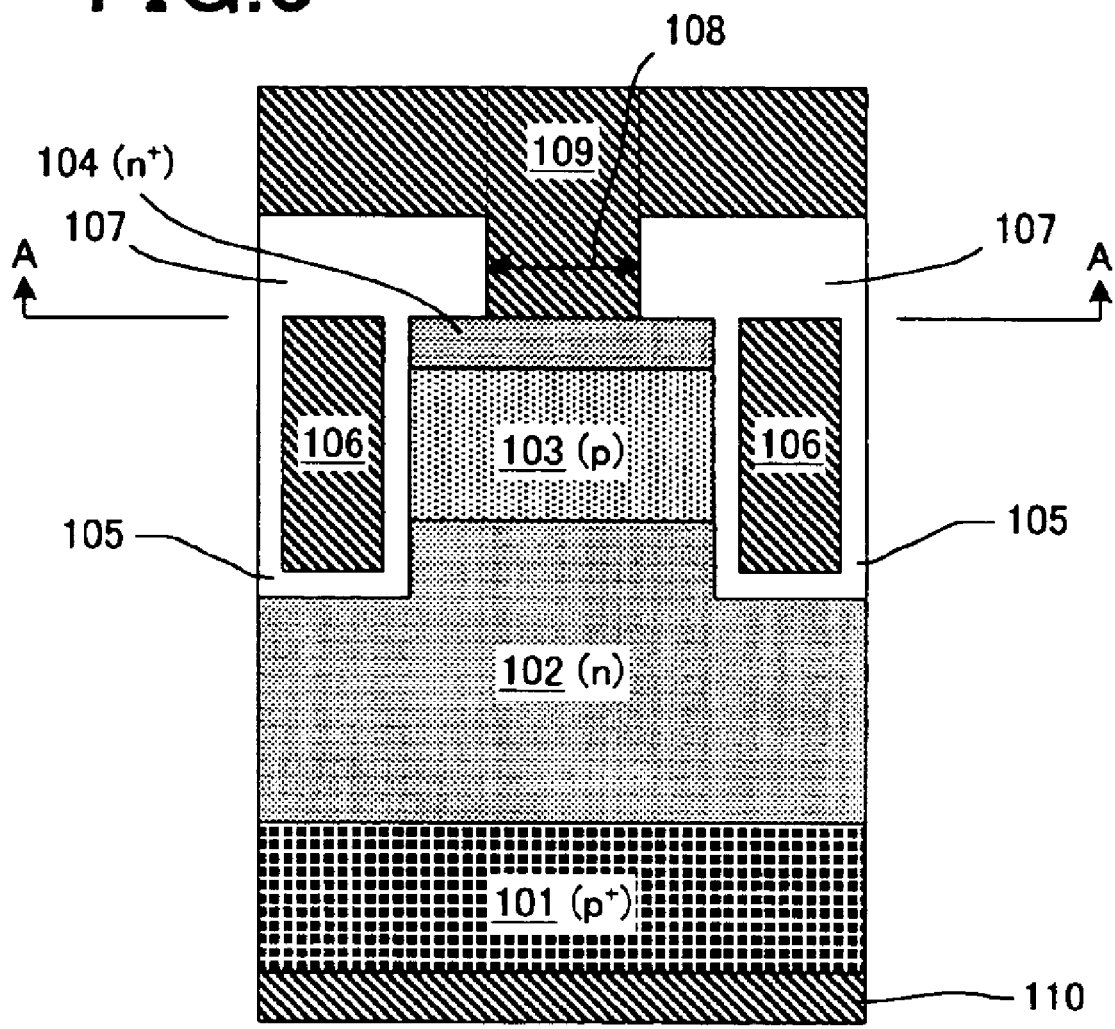
FIG. 3 is an elevation sectional view (a portion C—C) showing structure of the field-effect-type semiconductor device directed to the first embodiment.

FIG. 1 through FIG. 3 show structure of a field-effect-type semiconductor device directed to a first embodiment. FIG. 2 shows a sectional view of a portion B—B in FIG. 1. FIG. 3 shows a sectional view of a portion C—C in FIG. 1. FIG. 1 shows a sectional view of a portion A—A (this level is termed as "surface" in this specification) in FIG. 2 and in FIG. 3. This field-effect-type semiconductor device is so-called an insulated gate-type bipolar transistor (IGBT) and has trench-type gate structure. This field-effect-type semiconductor device is generally structured such that an emitter region and gate electrodes are arranged on a surface of a semiconductor substrate (surface side in FIG. 2 and FIG. 3) and a collector region and the like are arranged on other face of the substrate (bottom side in FIG. 2 and FIG. 3). In the specification, a semiconductor substrate is defined as the entirety of a monocrystal silicon layer including layers formed by epitaxial growth on a silicon wafer as a start substrate.

That is, trench-structured gate electrodes 106 as well as a P$^+$ emitter region 100 and an N$^+$ emitter region 104 are arranged on the surface level of the semiconductor substrate. The gate electrodes 106 are insulated from the substrate by gate dielectrics 105 and interlayer dielectrics 107. Beneath the P$^+$ emitter region 100 and the N$^+$ emitter region 104, there is arranged a P channel region 103 that faces to the gate electrodes 106 via the gate dielectrics 105. The bottom of the P channel region 103 is shallower than the bottoms of the gate electrodes 106. Above the P$^+$ emitter region 100 and the N$^+$ emitter region 104, and the gate electrodes 106, there is arranged an emitter electrode 109. The emitter electrode 109 is in contact with both the P$^+$ emitter region 100 and the P channel region 103 in FIG. 2 (portion B—B). In FIG. 3 (portion C—C), the emitter electrode 109 is in contact with the N$^+$ emitter region 104.

An N drift region 102 is formed below the P channel region 103. Most part of the N drift region 102 is deeper than the bottoms of the gate electrodes 106 and extends to almost the entirety of the semiconductor substrate. Further beneath the N drift region 102, there is arranged a P$^+$ collector region 101. A collector electrode 110 is formed in contact with the bottom of the P$^+$ collector region 101. In the field-effect-type semiconductor device directed to the first embodiment, a range indicated with an arrow Y in FIG. 1 is a unit repeated in a vertical direction in FIG. 1.

As shown in FIG.1, in the field-effect-type semiconductor device of the present embodiment, the gate electrodes 106 are arranged in a vertically-striped pattern. The N$^+$ emitter region 104, the P$^+$ emitter region 100 and the P channel region 103 are arranged in a band area between the gate electrodes 106. In a vertical direction in FIG. 1, there are disposed N$^+$ emitter regions 104 periodically. Each N$^+$ emitter region 104 faces to gate electrodes 105 via gate dielectrics 105 on both right and left edges in FIG. 1. That is, each N$^+$ emitter region 104 is formed between adjoining gate electrodes 106.

A P$^+$ emitter region 100 is arranged between adjoining two N$^+$ emitter regions 104. Each P$^+$ emitter region 100 is in contact with N$^+$ emitter regions 104 at both upper and lower edges in FIG. 1. However, the P$^+$ emitter region 100 does not occupy the entirety of an area between two adjoining gate electrodes 106 in a horizontal direction in FIG. 1. A width of a P$^+$ emitter region 100 in FIG. 1 is narrower than a width 108 (termed as a "contact aperture 108" hereinafter) where the emitter electrode 109 is in contact with the substrate. A P channel region 103 occupies the rest of the substrate's surface. That is, a P$^+$ emitter region 100 and a P channel region 103 constitute a P emitter region. Thus, in the field-effect-type semiconductor device of the present embodiment, an N$^+$ emitter region 104 and a P-type region (P$^+$ emitter region 100 and a P channel region 103) are arrange alternately and discretely in an area between adjoining two gate electrodes 106 and a vertically-striped pattern is formed thereon.

In the field-effect-type semiconductor device of the present embodiment, acceptor concentration of the P channel region 103 is as low as to the extent that conduction type can be reversed to N-type by driving voltage to the gate electrodes 106 and at the same time, as high as to the extent that current between the emitter electrode 109 and the collector electrode 110 can be avoided under OFF state. Acceptor concentration of the P$^+$ emitter region 100 is higher than that of the P channel region 103 by two digits, so conduction type is not reversed by driving voltage to the gate electrodes 106. It is preferable that a width d of the P channel region 103 in a horizontal direction in FIG. 3 is 2 $\mu$m or narrower. Thereby, electrons supplied from the N$^+$emitter region 104 can more surely be made to diffuse on the surfaces facing to the gate electrodes 106. Furthermore, a width W, namely, a vertical directional width of the P emitter region in FIG. 1 (i.e., a channel width) is wider than a width X, namely, a vertical direction width of the N$^+$ emitter region 104 (i.e., an interval between adjoining channels). To be more specific, it is preferable that a ratio X/W is between $\frac{1}{10}$ and $\frac{1}{2}$. That is, in case the ratio X/W lowers $\frac{1}{10}$, i.e., in case the N$^+$ emitter region 104 is too small, ON-resistance becomes high. On the contrary, in case X/W surpasses $\frac{1}{2}$, short-circuit current becomes large, which is not preferable. An optimum value of X/W is around ⅕. Furthermore, it is preferable that the width X of the N⁺ emitter region 104 is 20 μm or narrower. That is, in case it is too wide, latch-up phenomenon is likely to occur.

In the field-effect-type semiconductor device of the present embodiment, current between the emitter electrode 109 and the collector electrode 110 is controlled by applying voltage to the gate electrodes 106. That is, conduction type around the surfaces of the P channel region 103 (the surfaces that face to respective side walls of the gate electrodes 106) is reversed by voltage of the gate electrodes 106, whereby a current path is formed. Since N⁺ emitter regions 104 are arranged in a horizontally striped pattern in FIG. 1, there coexist portions including an N⁺ emitter region 104 (the portion C—C in FIG. 1, i.e., the region of which cross sectional view is shown in FIG. 3) and portions without an N⁺ emitter region 104 (the portion B—B in FIG. 1, i.e., the region of which cross sectional view is shown in FIG. 2) in the field-effect-type semiconductor device of the present embodiment. In the region including the N⁺ emitter region 104 (in FIG. 3), there exists the P channel region 103 below the N⁺ emitter region 104. That is, the N⁺ emitter region 104 and the P channel region 103 are in contact at a surface facing to a gate electrode 106. Accordingly, this portion can be effective channel when conduction type of area around the surface of the P channel region 103 is reversed. However, in the portion without N⁺ emitter region 104 (the portion B—B in FIG. 1, i.e., the region of which cross sectional view is shown in FIG. 2), resistance at its channel section is higher than resistance at the channel section of the portion including the N⁺ emitter region 104. Therefore, a width of an effective channel portion is limited to a region indicated with an arrow X in FIG. 1. This width is narrower than the entirety of a unit Y repeated in a vertical direction. A channel width of this embodiment is thus more limited than a channel of the described prior art.

Thereby, the following effects arise. Firstly, short-circuit current is not significantly large while ON-resistance is low. Since a channel width is limited, as described, short-circuit current does not become large. Therefore, even if a load is short-circuited, current large enough to destroy device does not flow. On the other hand, the followings are the reasons why ON-resistance is low. Firstly, a width as wide as the region X in FIG. 1 is required as a channel width to secure ON current under normal operation state. In other words, a conventional field-effect-type semiconductor device has had an excessively wide channel width that corresponds to the entirety of a unit Y repeated in a vertical direction. Therefore, short-circuit current which is ten-times as large as normal ON current or larger than that flew. On the contrary, in the field-effect-type semiconductor device of the present embodiment, a channel width is narrowed to a minimum essential, whereby rise of ON resistance is avoided and suppression of short-circuit current is intended.

Furthermore, latch-up phenomenon is unlikely to occur under OFF operation. That is, since N⁺ emitter regions 104 are formed in a stripe patter instead of a ladder pattern, a contact area of a P-type region and the emitter electrode 109 (i.e., an area incorporating the P⁺ emitter region 100 and the P channel region 103 arranged left and right sides of the P⁺ emitter region 100 in FIG. 1) is large. Since voltage between the collector electrode 110 and the emitter electrode 109 becomes high under OFF state, holes can escape to the emitter electrode 109 from the P channel region 103 that is in contact with the emitter electrode 109. Therefore, the escape path is wide. Thereby, excessive holes in the P channel region 103 immediately escape to the emitter electrode 109 after it shifts to OFF state. That is, it does not fall into a situation like that base current flows into a parasitic bipolar transistor that consists of an N⁺ emitter region 104, a P channel region 103 and an N drift region 102. Therefore, there is unlikely to occur latch-up phenomenon caused by mechanism that a parasitic NPNP thyrister consisting of an N⁺ emitter region 104, a P channel region 103, an N drift region 102, and a P⁺ collector region 101 is turned ON.

Furthermore, in the field-effect-type semiconductor device of the present embodiment, an emitter is constituted by not only a P⁺ emitter region 100 but also a P⁺ emitter region 100 and an N⁺ emitter region 104. Therefore, the N⁺ emitter region 104 and the N drift region 102 are in contact with each other through the N channel formed in the P channel region 103 in FIG. 3, under ON state. Since a path for electrons is thus secured, inconstancy of electrons in device does not occur. This also contributes to lowering of ON-resistance and prevention of latch-up phenomenon. Furthermore, a contact area of the P⁺ emitter region 100 and the emitter electrode 109 is smaller than the case that an emitter is constituted by a P⁺ emitter region only. Such a small contact area prevents excessive amount of holes from escaping to the emitter electrodes 109 under ON state. This aspect also contributes to lowering of ON-resistance.

On the other hand, as entirety of a P-type region for a P⁺ emitter region 100 and a P channel region 103, some extent of a contact area with an emitter electrode 109 is secured. Therefore, holes can escape to the emitter electrode 109 without problem after switch off, especially, after large current such as short-circuit current is turned off. Therefore, it never falls into a situation like that base current flows into a parasitic bipolar transistor that consists of an N⁺ emitter region 104, a P channel region 103, and an N drift region 102. Accordingly, it never occurs that a parasitic NPNP thyrister consisting of an N⁺ emitter region 104, a P channel region 103, an N drift region 102, and a P⁺ collector region 101 is turned ON. This aspect also contributes to lowering of ON-resistance and prevention of latch-up phenomenon.

Figure 4:
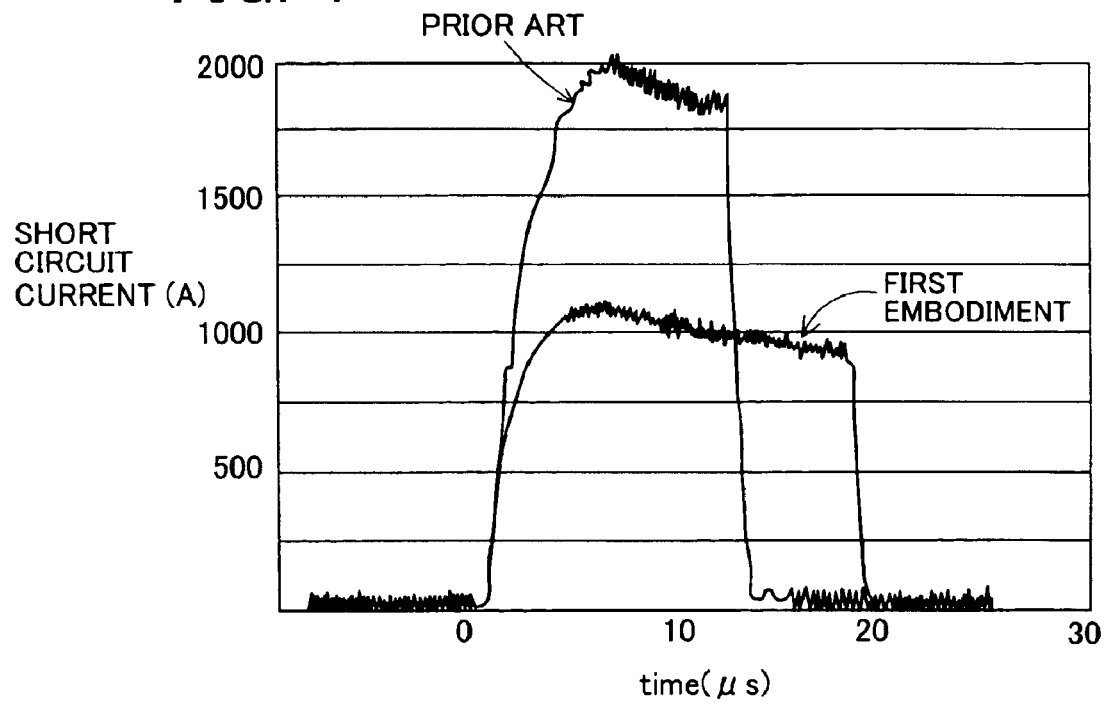
FIG. 4 is a graph showing short-circuit current of the field-effect-type semiconductor device directed to the first embodiment in comparison with a conventional one.
Figure 5:
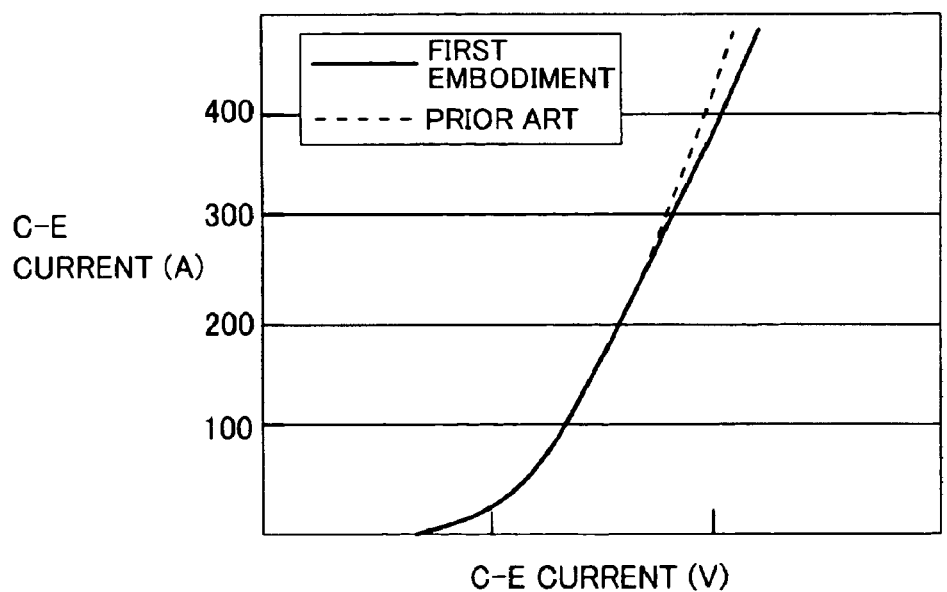
FIG. 5 is a graph showing relation of collector-emitter voltage and collector-emitter current in the field-effect-type semiconductor device directed to the first embodiment in comparison with conventional one.
Figure 6:
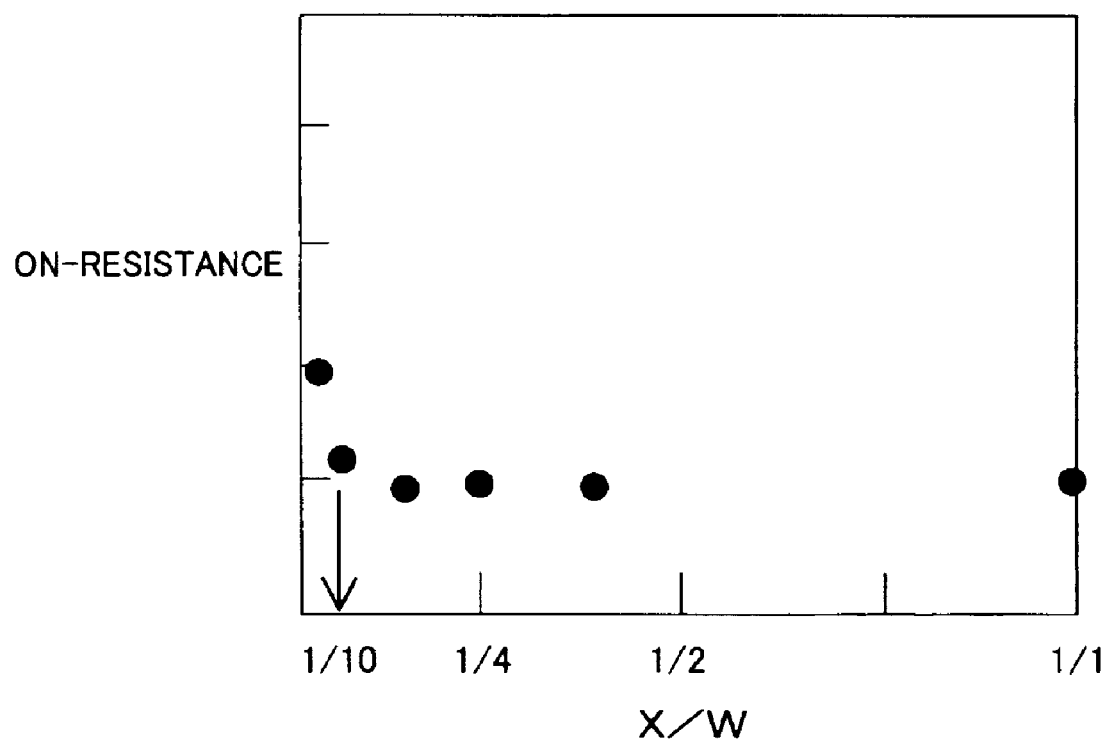
FIG. 6 is a graph showing relation of X/W in FIG. 1 and ON-resistance, with respect to the field-effect-type semiconductor device directed to the first embodiment.

FIG. 4 through FIG. 6 show various characteristics of the field-effect-type semiconductor device of the present embodiment the inventors have observed and measured. FIG. 4 shows a measurement result of short-circuit current in comparison with this embodiment and prior art. From FIG. 4, it is apparent that short-circuit current of this embodiment is only about a half of the prior art. FIG. 5 shows a measurement result of collector-emitter current and collector-emitter voltage in comparison with this embodiment and the prior art. From FIG. 5, it is apparent that there is not significant difference between them. From this measurement result, it is apparent that ON-resistance of this embodiment is as low as the prior art, generally. FIG. 6 shows relation of ON-resistance and X/W-value obtained by variously changing the X/W-value with respect to the field-effect-type semiconductor device of the present embodiment. From FIG. 6, it is apparent that if X/W-value is ¹/₁₀ or higher, ON-resistance level does not differ significantly.

There will be described manufacturing process of the field-effect-type semiconductor device directed to the present embodiment by referring to FIG. 7 through FIG. 10. For manufacturing the field-effect-type semiconductor device directed to the present embodiment, it is assumed that a P⁺ silicon wafer is a start substrate. The P⁺ silicon of the wafer corresponds to a P⁺ collector region 101. An N-type silicon layer is formed on the surface of the wafer by epitaxial growth. This N-type silicon layer corresponds to an N drift region 102. Or alternatively, an N-type silicon wafer can be a start substrate. In that case, N-type silicon of the wafer corresponds to an N drift region 102. A P$^+$ collector region 101 can be formed by adding P-type impurity from the bottom side of the N-type silicon wafer or by forming P-type silicon layers on surface of the bottom side of the N-type silicon wafer.

Next, there is formed a thermal oxide film of which thickness is about 700 nm on the N-type silicon wafer by pyrogenic oxidation. Patterning of the thermal oxide film is made by photolithography and etching. Thereby, the thermal oxide film remains on a frame portion of the wafer. As a result, an aperture where the N-type silicon layer appears is formed on the entirety of a portion on which devices are to be formed. Next, a thermal oxide film 107b is formed on the N-type silicon layer again. Heating temperature is 900° C. and thickness of the film is 400 nm.

A resist pattern is formed on the thermal oxide film 107b by photolithography. A resist pattern to be formed thereon is a pattern to take a portion for a P channel region 103 as an opening. This resist pattern works as a mask and boron is injected thereon by ion injection of which accelerating voltage is 60 kV. Amount of dose is $4.7 \times 10^{13}$ cm$^{-2}$. After that, under nitrogen atmosphere, diffusion of boron is made with 1150° C. of heat processing. Thereby, there is formed a P well of which depth is 5 μm. This P well corresponds to a P channel region 103. A thermal oxide film 107c is further formed on the thermal oxide film 107b by means of CVD method.

Figure 7:
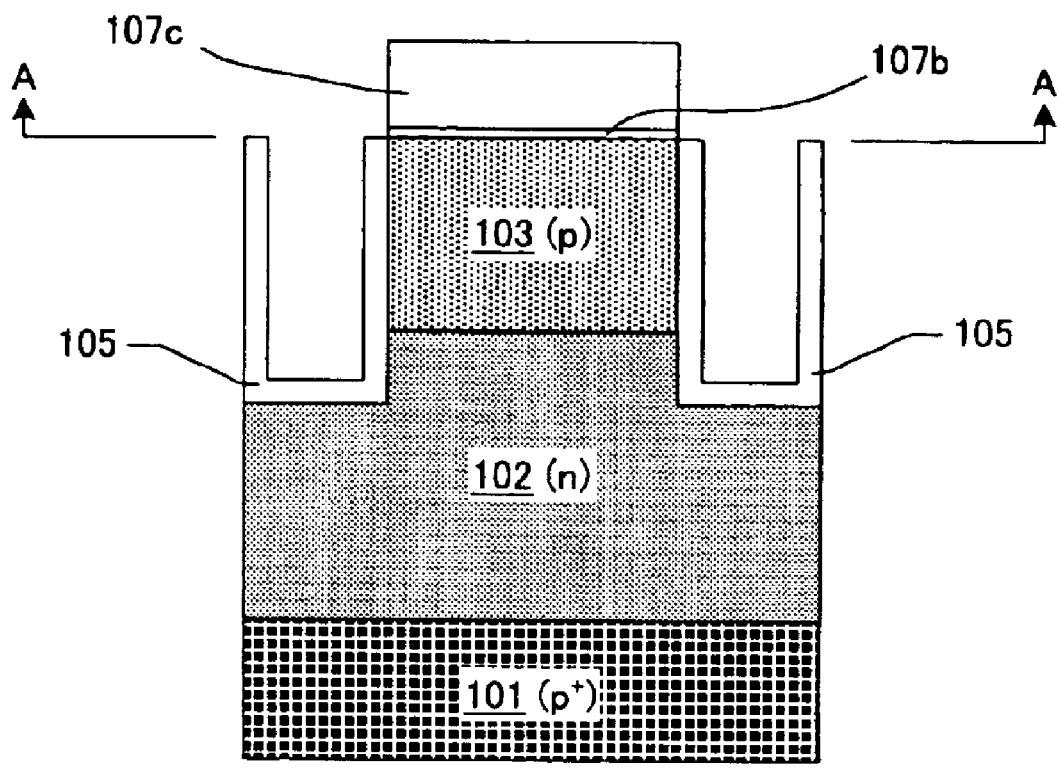
FIG. 7 is an elevation sectional view (1) illustrating manufacturing process of the field-effect-type semiconductor device directed to the first embodiment.

Further on, a resist pattern is formed on the thermal oxide film by photolithography. A resist pattern to be formed thereon is a pattern to take portions for gate electrodes 106 as openings. This resist pattern is used as a mask so as to eliminate the thermal oxide films 107C and 107b by means of RIE method. Thereby, remaining thermal oxide films 107c and 107b work as mask for silicon etching. Silicon etching is made with the oxide film mask by means of RIE method. Thereby, there is formed trench of which depth is 6 μm. Etching is made on the sidewalls of thus formed trench by means of CDE method. After that, a thermal oxide film is formed on a surface of the trench with 1100° C. of heat processing and the oxide film is eliminated. Thereby, defects on the sidewalls of the trench are eliminated. After that, a thermal oxide film of 100 nm thick is formed on the surface of the trench with 1100° C. of heat processing. This thermal oxide film corresponds to a gate dielectric 105. FIG. 7 shows a cross sectional view of the so far manufactured.

Figure 8:
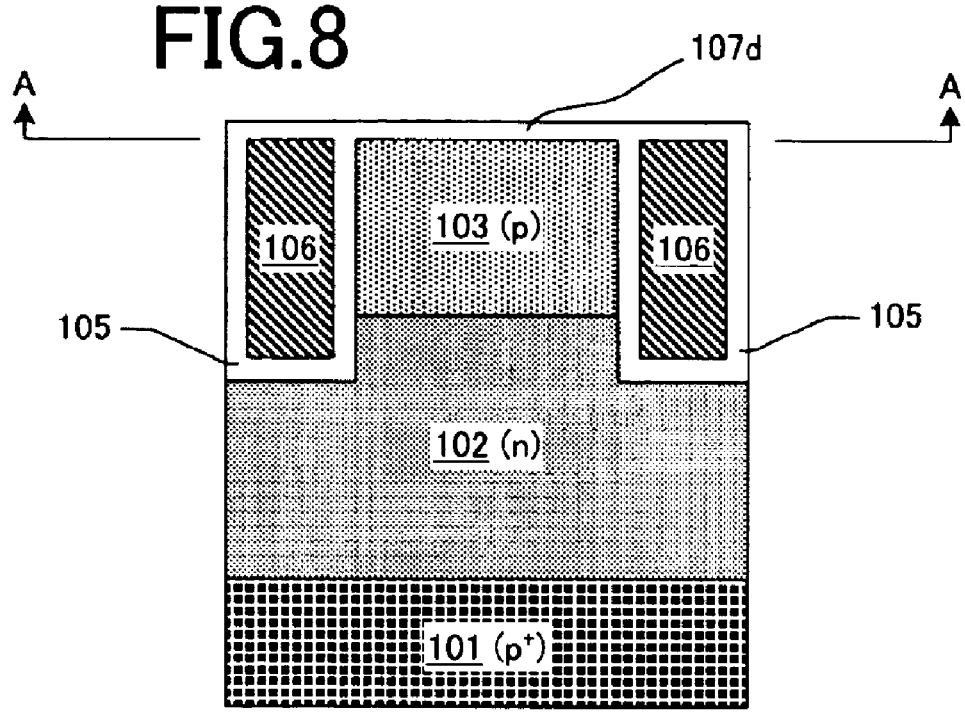
FIG. 8 is an elevation sectional view (2) illustrating manufacturing process of the field-effect-type semiconductor device directed to the first embodiment.

Next, a polycrystal silicon film of 800 nm thickness is formed by means of CVD method. Further on, 950° C. of heat processing is applied under phosphorous oxychloride atmosphere. Thereby, phosphorous is diffused into the polycrystal silicon film. After that, excessive polycrystal silicon and remaining oxide film mask are eliminated by means of photolithography and etching. Polycrystal silicon of a portion higher than the level of the trench opening is to be eliminated. However, a polycrystal silicon portion that is a wiring to the gate electrodes 106 (see "311" in FIG. 17 and the like, the wiring is termed as "gate wiring" hereinafter) is left. Thereby, trench-structured gate electrodes 106 and wirings for them are formed. Next, a thermal oxide film 107d is formed on surfaces of the P channel region 103 and the gate electrodes 106 under 950° C. of heat processing. Thickness of the film 107d is 30 nm. FIG. 8 shows a cross sectional view of the so far manufactured (up to this stage, cross sectional view of the portion B—B and that of the portion C—C are identical).

Figure 9:
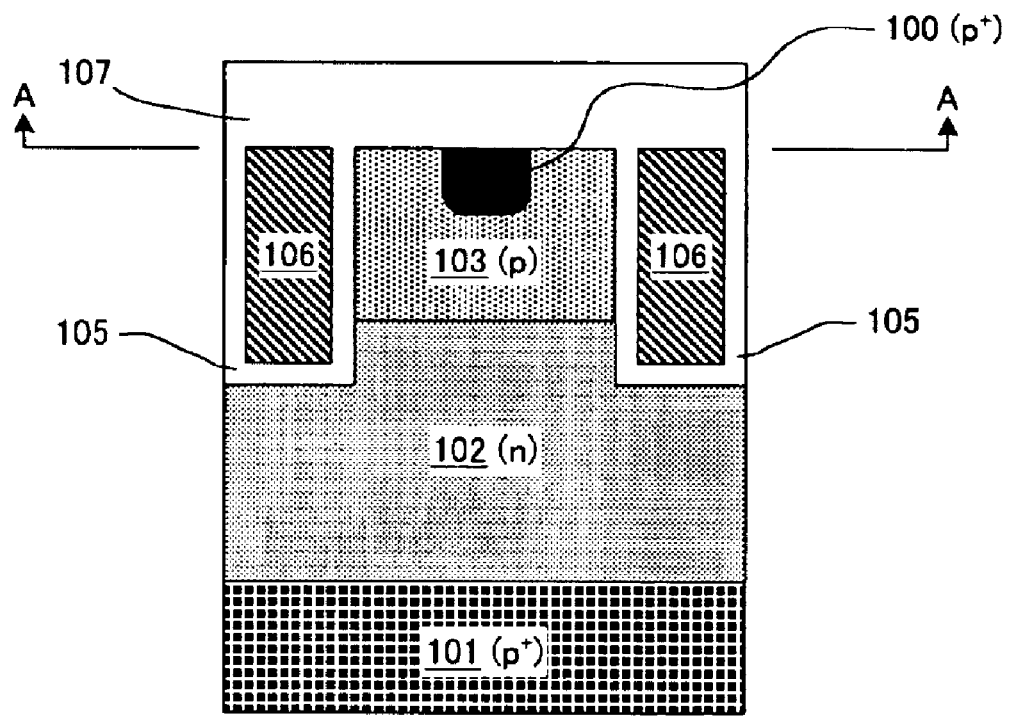
FIG. 9 is an elevation sectional view ((3), a portion B—B) illustrating manufacturing process of the field-effect-type semiconductor device directed to the first embodiment.
Figure 10:
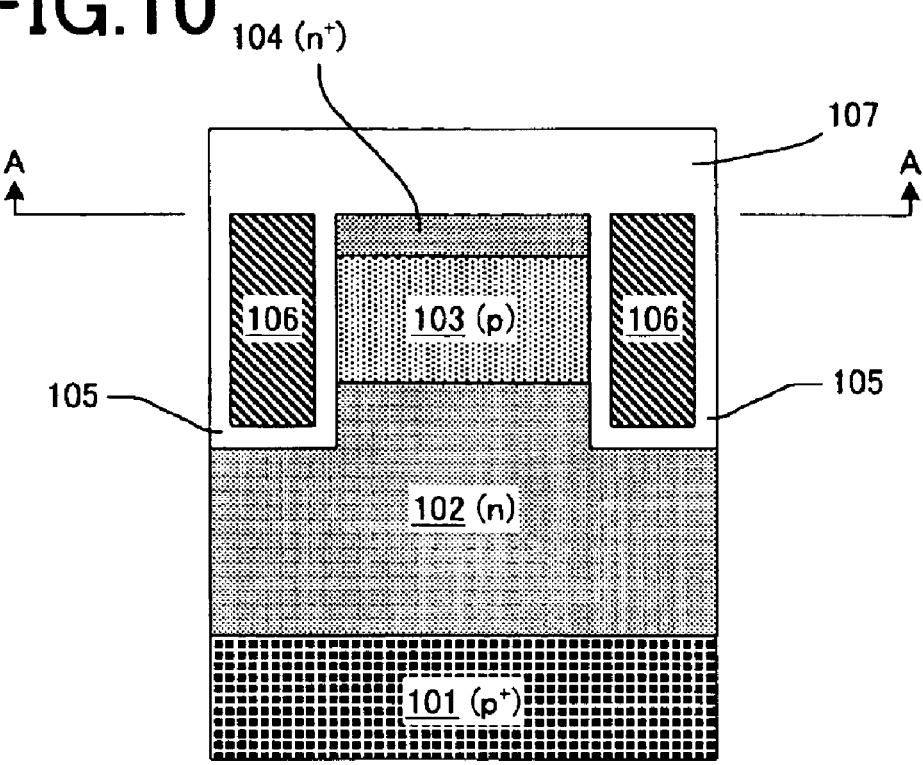
FIG. 10 is an elevation sectional view ((3), a portion C—C) illustrating manufacturing process of the field-effect-type semiconductor device directed to the first embodiment.

Further on, a resist pattern is formed on the thermal oxide film 107d by photolithography. A resist pattern to be formed thereon is a pattern to take a portion for a P$^+$ emitter region 100 as an opening. This resist pattern works as a mask and boron is injected thereon by ion injection of which accelerating voltage is 70 kV. Amount of dose is $4 \times 10^{15}$ cm$^{-2}$. A new resist pattern is formed on the thermal oxide film by photolithography after the last resist pattern is eliminated. The new resist pattern to be formed thereon is a pattern to take a portion for an N$^+$ emitter region 104 as an opening. This resist pattern works as a mask and phosphorus is injected thereon by ion injection of which accelerating voltage is 120 kV. After that, a BPSG film is formed on the latest thermal oxide film thickness of which is 1.5 μm. This BPSG film corresponds to an interlayer dielectric 107. After that, 950° C. of heat processing is made under nitrogen atmosphere. Thereby, the interlayer dielectric 107 is flattened and a P$^+$ emitter region 100 and an N$^+$ emitter region 104 are formed due to heat diffusion of chemical elements to which ions are injected. FIG. 9 and FIG. 10 shows cross sectional views a portion B—B and a portion C—C of the so far manufactured, respectively.

Next, patterning of an interlayer dielectric 107 is made by means of photolithography and etching. Thereby, an interlayer dielectric 107 are eliminated at portions corresponding to contact openings 108 and at portions where the gate electrodes 106 are in contact with gate wiring. Thereby, the P$^+$ emitter region 100, the P channel region 103 and the N$^+$ emitter region 104 at the contact opening 108 are made to appear. Furthermore, a contact portion of a gate electrode 106 is made to appear, as well. Further on, a barrier metal layer mainly made of titanium is formed on portions appearing from openings and remaining interlayer dielectric 107 and an aluminum layer is piled above the barrier metal layer by means of sputtering methods. After that, patterning of the barrier metal layer and the aluminum layer is made by means of photolithography and etching (wet etching and RIE). Thereby, an emitter electrode 109 is formed. Furthermore, upper wirings for gate wirings are formed, as well. Next, a collector electrode 110 is formed on the bottom face of the P$^+$ collector region 101 by means of sputtering method. Thereby, a field-effect-type semiconductor device of the present embodiment is finally completed.

In case an N-type silicon wafer is a start substrate, structure of an emitter side (gate electrodes 106, a P$^+$ emitter region 100, an emitter electrode 109, and the like) can be formed firstly and formation of a P$^+$ collector region 101 can come next.

[Second Embodiment]

Figure 11:
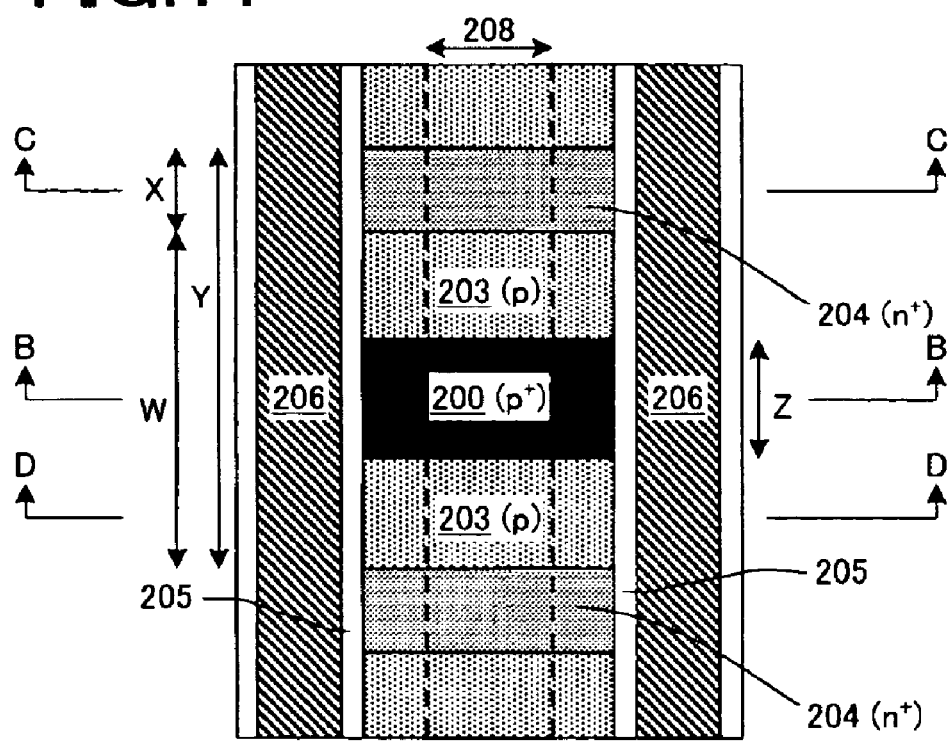
FIG. 11 is a plane sectional view (a portion A—A) showing structure of a field-effect-type semiconductor device directed to a second embodiment.
Figure 12:
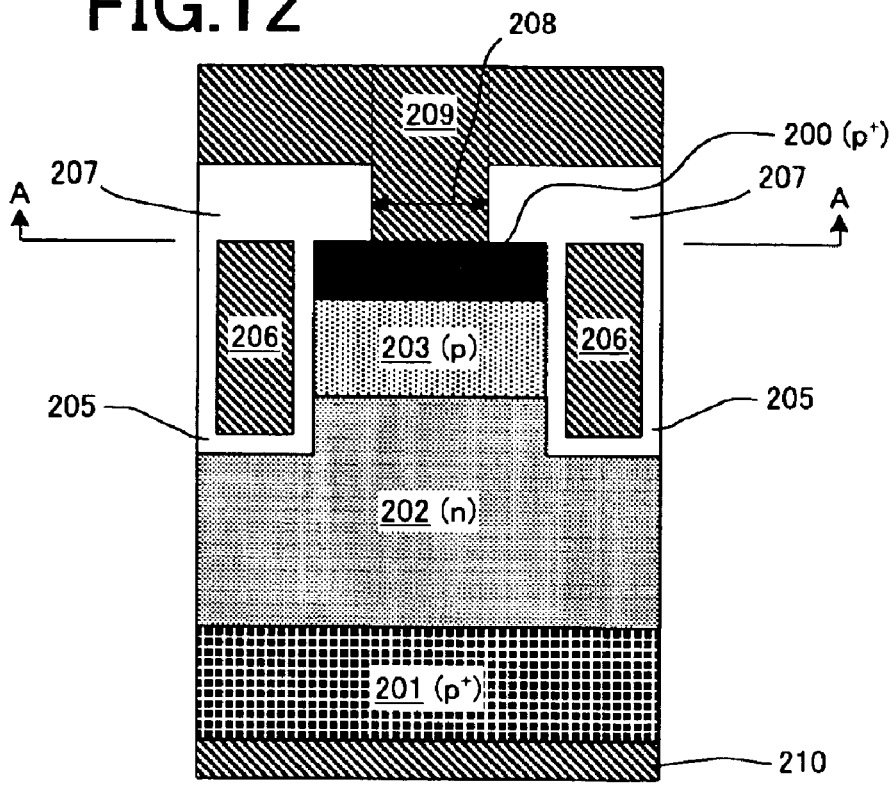
FIG. 12 is an elevation sectional view (a portion B—B) showing structure of the field-effect-type semiconductor device directed to the second embodiment.
Figure 13:
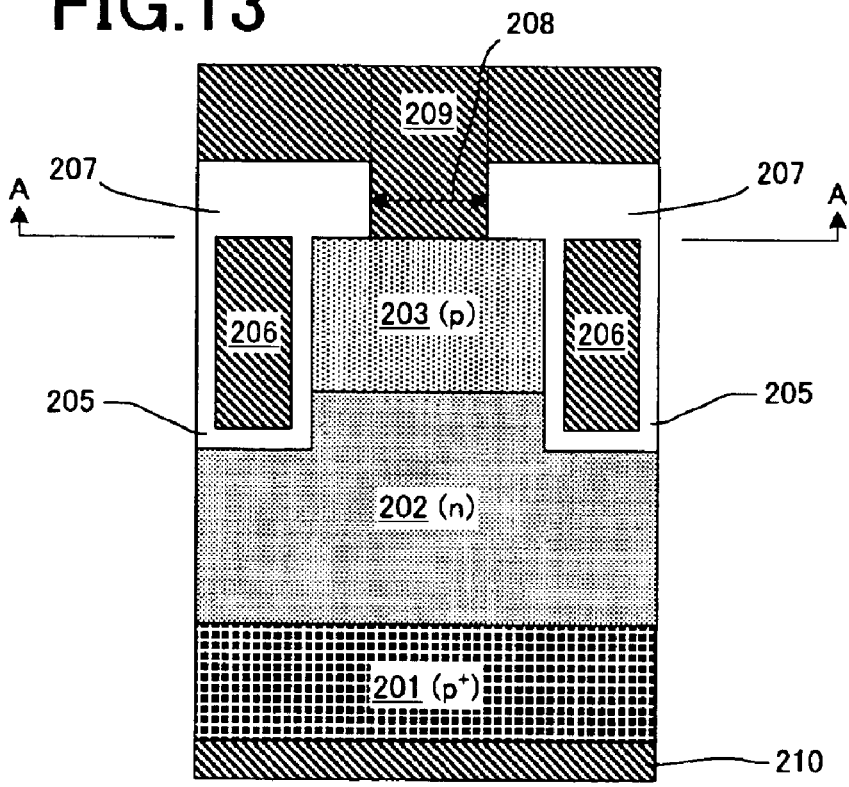
FIG. 13 is an elevation sectional view (a portion D—D) showing structure of the field-effect-type semiconductor device directed to the second embodiment.

FIG. 11 through FIG. 13 show structure of a field-effect-type semiconductor device directed to a second embodiment. FIG. 12 shows a sectional view of a portion B—B in FIG. 11. FIG. 13 shows a sectional view of a portion D—D in FIG. 11. FIG. 11 shows a sectional view of a portion A—A in FIG. 12 and in FIG. 13. Furthermore, the sectional view of the portion C—C in FIG. 11 is substantially same as FIG. 3 of which numberings are changed from "1" to "2". Hereinafter, numberings should be interpreted like that when FIG. 3 is referred in this embodiment. The field-effect-type semiconductor device of this embodiment is common to the first embodiment in terms of being trench-gate type. Furthermore, except for structure of an emitter portion, other structure of it is same as the first embodiment. Furthermore, an N$^+$ emitter region 204 in its emitter portion is same as the first embodiment. Only the structure of a P emitter region in its emitter portion differs from the first embodiment.

The structure of a P emitter region in the field-effect-type semiconductor device of the present embodiment will be described. As shown in FIG. 11, a P$^+$ emitter region 200 is arranged in parallel to an N⁺ emitter region 204. Accordingly, the P⁺ emitter region 200 is not in contact with the N⁺ emitter region 204. Similar to both left and right ends of the N⁺ emitter region 204 in FIG. 11, the left and right ends of the P⁺ emitter region 200 in FIG. 11 face to gate electrodes 206 via gate dielectrics 205. That is, the P⁺ emitter region 200 is formed extending to the adjoining gate electrodes 206. However, the P⁺ emitter region 200 does not occupy the entirety of the area between adjoining two N⁺ emitter regions 204 in a vertical direction in FIG. 11. In rest of the area, P channel regions 203 occupy a surface of the semiconductor substrate. That is, a P emitter region consists of a P⁺ emitter region 200 and a P channel region 203. In the field-effect-type semiconductor device of the present embodiment also, an N⁺ emitter region 204 and a P-type region (P⁺ emitter region 200 and a P channel region 203) are arranged alternately and discretely in a region between adjoining two gate electrodes 206 and a vertically stripe pattern is formed thereon. Furthermore, a P channel region 203, a P⁺ emitter region 200, and an N⁺ emitter region 204 are in contact with an emitter electrode 209.

In the field-effect-type semiconductor device of the present embodiment, following three matters are similar to the first embodiment: acceptor concentration at a P channel region 203 and a P⁺ emitter region 200; a ratio of X/W (W and X are a vertical directional width of a P emitter region and that of an N⁺ emitter region 204 in FIG. 11); and a width X of the N⁺ emitter region 204.

Except for difference of a mask pattern for forming a P⁺ emitter region 200, manufacturing process of the field-effect-type semiconductor device of the present embodiment is similar to the first embodiment.

In the field-effect-type semiconductor device of the present embodiment also, current between an emitter electrode 209 and a collector electrode 210 is controlled by applying voltage to the gate electrodes 206. Similar to the first embodiment, a channel width is limited in comparison with the entirety of a unit Y repeated in a vertical direction. Therefore, there are exhibited effects such as low ON-resistance, suppression of short-circuit current, prevention of latch-up phenomenon, and the like.

Furthermore, there are obtained the following peculiar merits. Firstly, ON-resistance and short-circuit current can be set separately from view point of designing. That is, short-circuit current can be controlled by adjusting a value of the ratio X/W in FIG. 11 whereas ON-resistance can be controlled by adjusting a value of a ratio Z/W in FIG. 11 (Z is a vertical directional width in a P⁺ emitter region 200 in FIG. 11). That is, the P⁺ emitter region 200 forms an escape path to the emitter electrode 109 for holes under ON state. Accordingly, in case a width Z is set to a comparatively large value, hole concentration becomes low and ON-resistance becomes comparatively high under ON state. On the contrary, in case a width Z is set to a comparatively small value, hole concentration becomes high and ON-resistance becomes comparatively low under ON state. As the second merit, such design can facilitate downsizing of a semiconductor device in a horizontal direction in FIG. 11. That is, since a P⁺ emitter region 200 and an N⁺ emitter region 204 are in parallel to each other, structure in a horizontal direction is simple. That is, there are not particular variations in structure in a direction from a gate electrode 206 to an adjoining gate electrode 206. Such simple structure contributes to higher integration design and cost-down.

[Third Embodiment]

Figure 14:
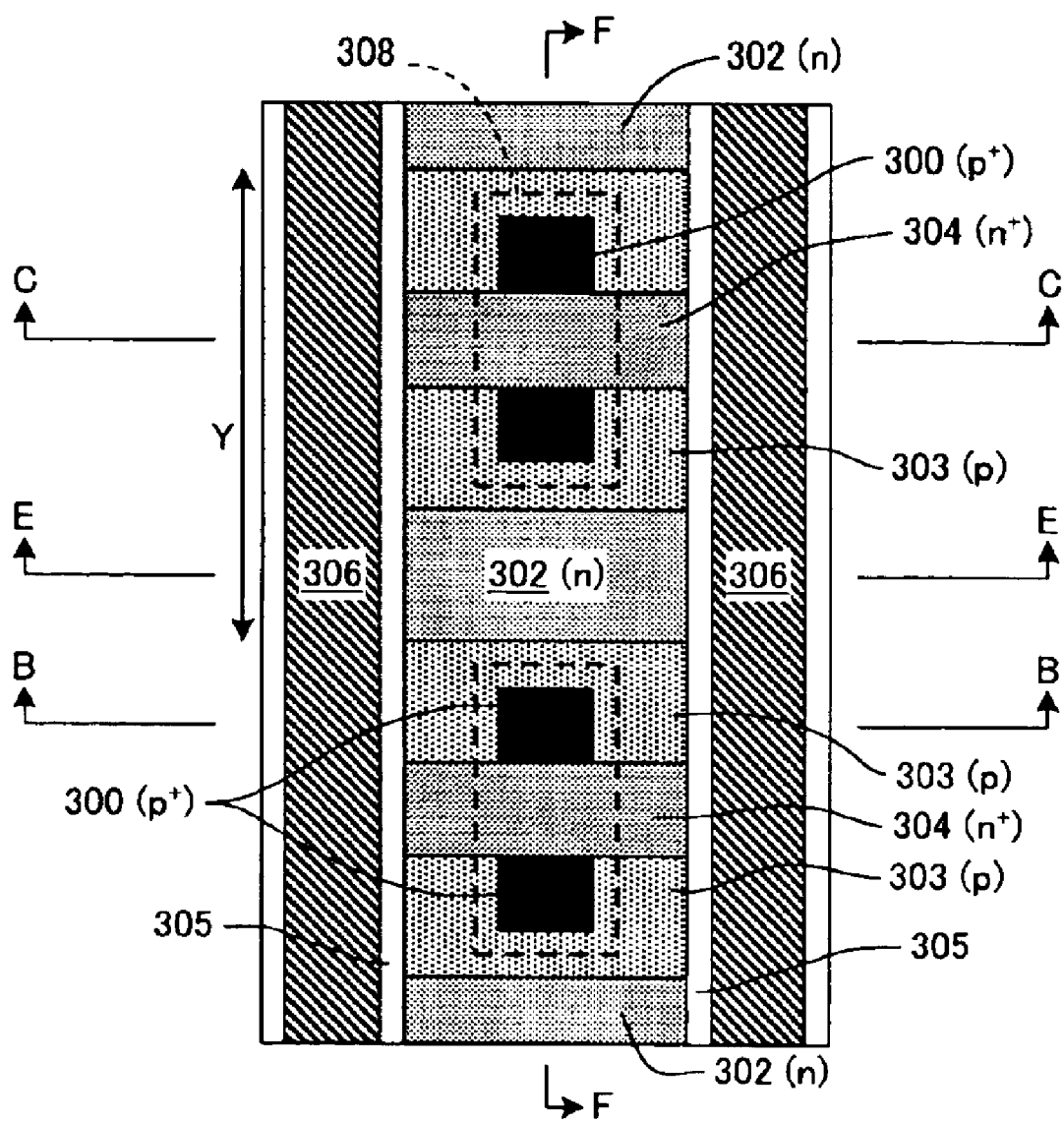
FIG. 14 is a plane sectional view (a portion A—A) showing structure of a field-effect-type semiconductor device directed to a third embodiment.
Figure 15:
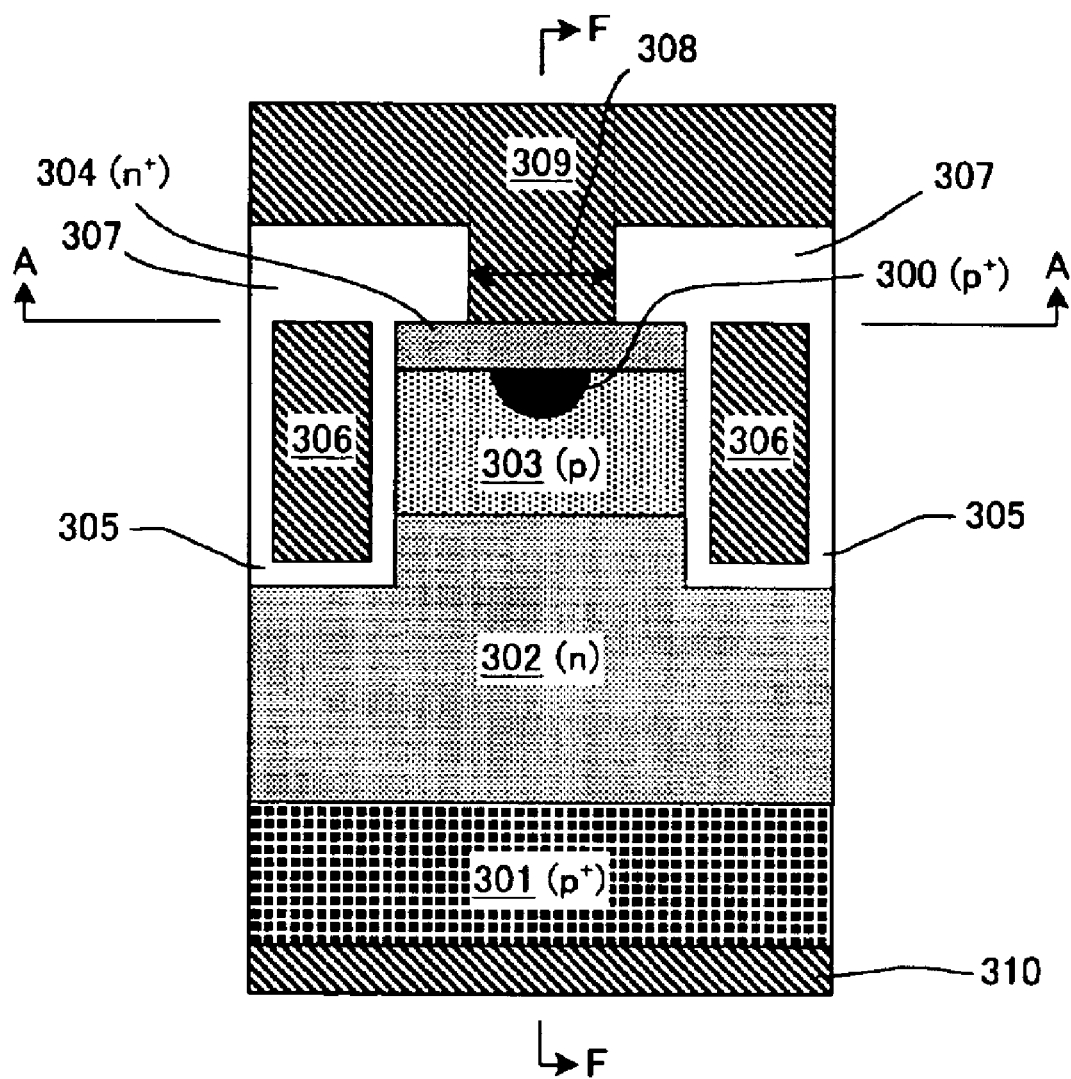
FIG. 15 is an elevation sectional view (a portion C—C) showing structure of the field-effect-type semiconductor device directed to the third embodiment.
Figure 16:
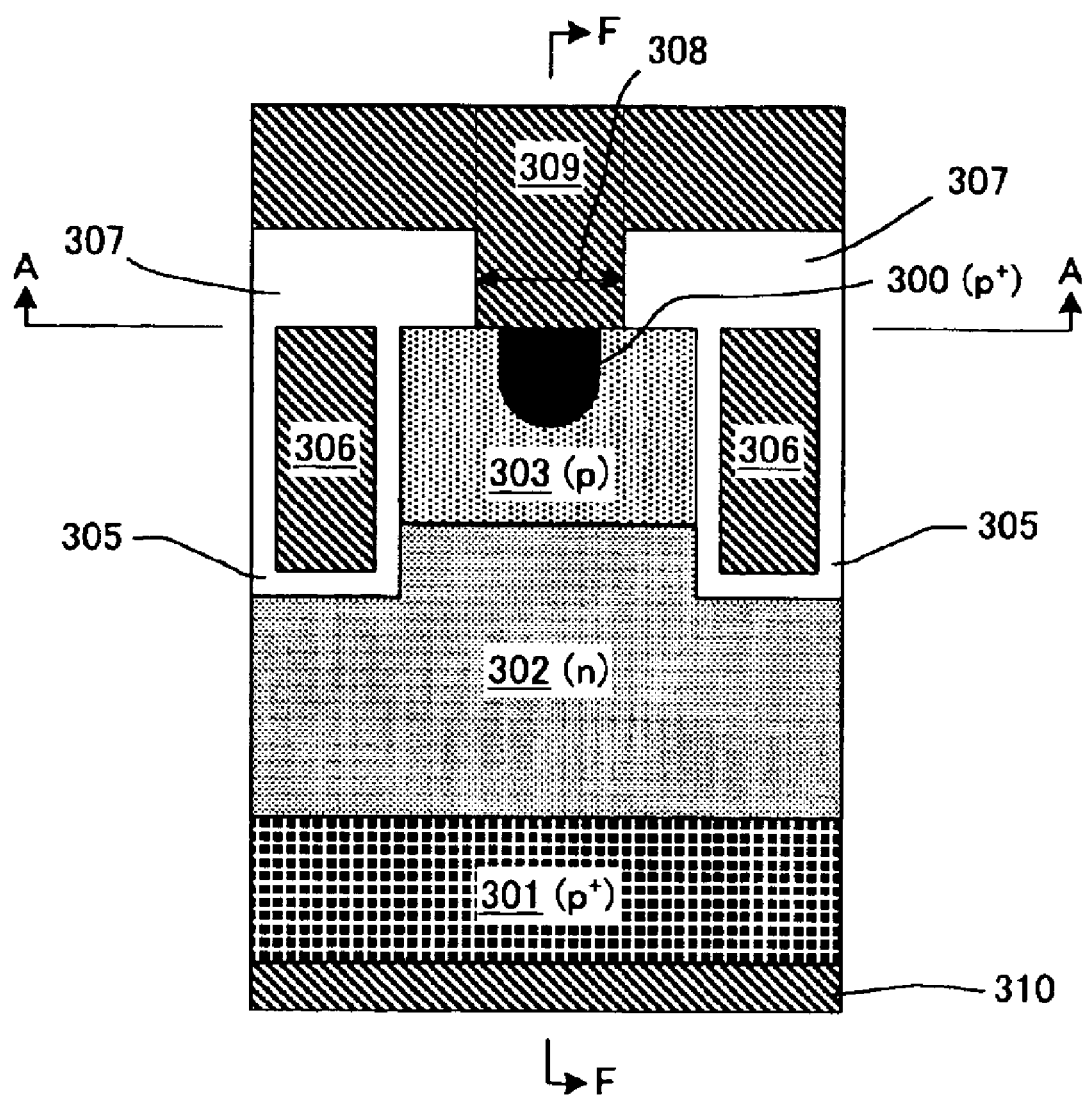
FIG. 16 is an elevation sectional view (a portion B—B) showing structure of the field-effect-type semiconductor device directed to the third embodiment.
Figure 17:
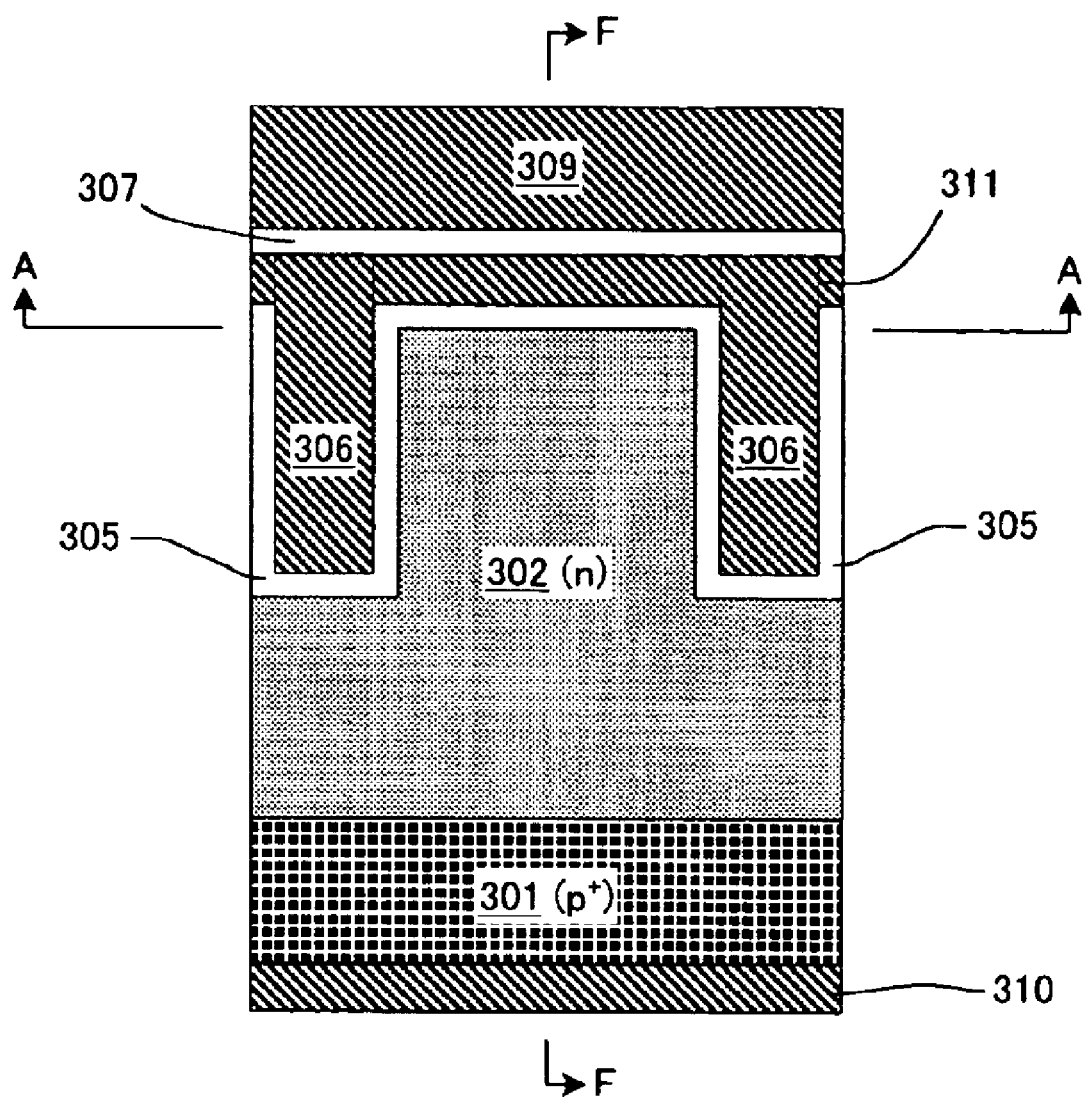
FIG. 17 is an elevation sectional view (a portion E—E) showing structure of the field-effect-type semiconductor device directed to the third embodiment.
Figure 18:
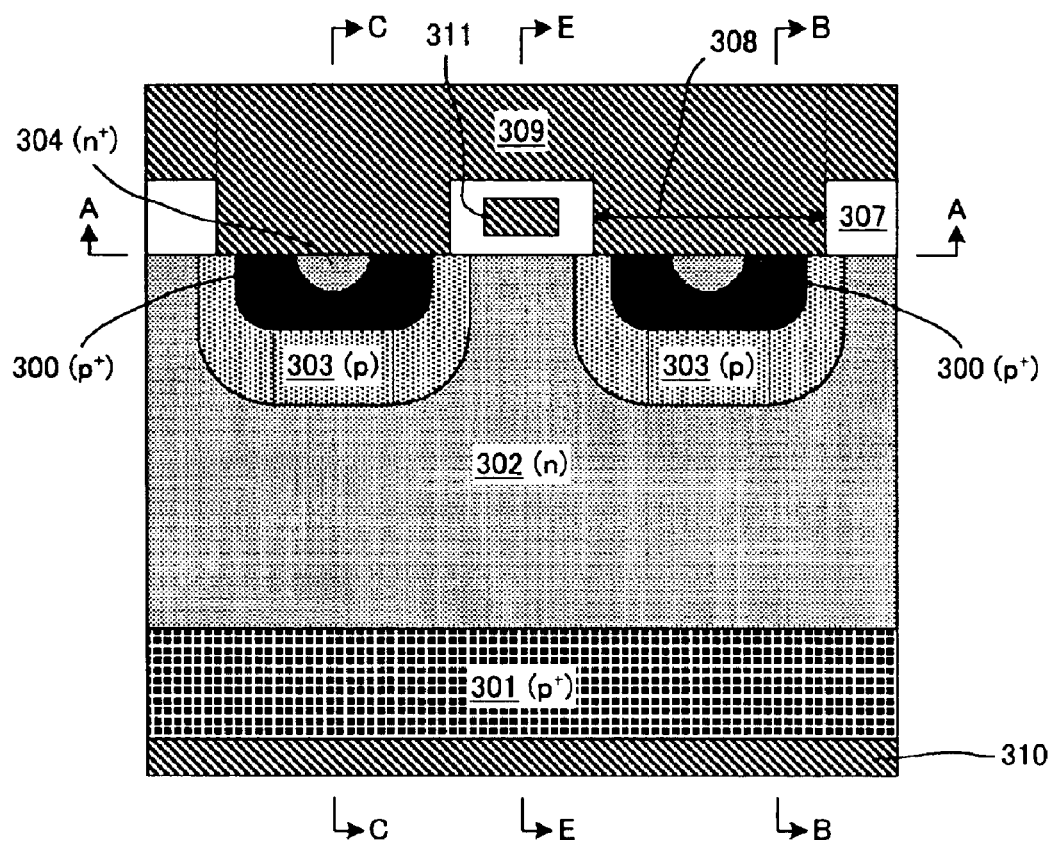
FIG. 18 is an elevation sectional view (a portion F—F) showing structure of the field-effect-type semiconductor device directed to the third embodiment.

FIG. 14 through FIG. 18 show structure of a field-effect-type semiconductor device directed to a third embodiment. FIG. 15 shows a sectional view of a portion C—C in FIG. 14. FIG. 16 shows a sectional view of a portion B—B in FIG. 14. FIG. 17 shows a sectional view of a portion E—E in FIG. 14. FIG. 18 shows a sectional view of a portion F—F in FIG. 14. FIG. 14 shows a sectional view of a portion A—A in FIG. 15 through FIG. 18. The field-effect-type semiconductor device of this embodiment is common to the first and second embodiments in terms of being trench-gate type. Furthermore, except for structure of an emitter portion and a contact opening 308, other structure of it is same as the first and second embodiments.

The structure of a P emitter region in the field-effect-type semiconductor device of the present embodiment will be described. As shown in FIG. 14, N⁺ emitter regions 304 are arranged like a horizontally stripe pattern in orthogonal to gate electrodes 306. In this point, the third embodiment is similar to the first and second embodiments. A P emitter region consisting of a P⁺ emitter region 300 and a P channel region 303 is arranged adjoining to top and bottom portions of each N⁺ emitter region 304 in FIG. 14. In each P emitter region, a P⁺ emitter region 300 is surrounded with a P channel region 303. A P⁺ emitter region 300 and a P channel region 303 for each of the n⁺ emitter regions 304 arranged up-and-down in FIG. 14 are in connected with each other below each N⁺ emitter region 304, as shown in FIG. 15 and FIG. 18. Furthermore, an N drift region 302 is arranged between two adjoining P emitter regions in FIG. 14. As shown in FIG. 17, any one of an N⁺ emitter region 304, a P⁺ emitter region 300, and a P channel region 303 is not arrange in this interval region. Therefore, an N drift region 302 reaches a portion A—A, i.e., surface. Thereby, it is apparent that emitter regions each of which consists of a P emitter region and an N⁺ emitter region are formed intermittently in the field-effect-type semiconductor device of the present embodiment.

In the field-effect-type semiconductor device of the present embodiment, a contact opening 308 is insularly arranged on only a portion in which an N⁺ emitter region 304 and a P emitter region exist. That is, contact openings 308 are discretely arranged between adjoining gate electrodes 306 while avoiding an N drift region 302. In this point, the third embodiment differs from the first and second embodiments where their contact openings 108 and 208 are long and arranged in parallel to gate electrodes 106 and 206, respectively. Size of a contact opening 308 in FIG. 14 is larger than a P⁺ emitter region 300 and smaller than a P channel region 303. Therefore, an emitter electrode 309 is in contact with an N⁺ emitter region 304, a P⁺ emitter region 300, and a P channel region 300. Furthermore, in the field-effect-type semiconductor device of the present embodiment, a gate wiring 311 for connecting gate electrodes 306 one another is provided on a portion E—E (FIG. 17 and FIG. 18) in FIG. 14. Thereby, equivalent voltage operation can be applied to each gate electrode 306. It should be noted that gate wirings exist outside of regions shown in drawings in the field-effect-type semiconductor device of the first and the second embodiments.

Except for difference of mask patterns for forming P channel regions 303, P⁺ emitter regions 300, and contact openings 308, manufacturing process of the field-effect-type semiconductor device of the present embodiment is similar to the first embodiment.

In the field-effect-type semiconductor device of the present embodiment also, current between an emitter electrode 309 and a collector electrode 310 is controlled by applying voltage to the gate electrodes 306. Similar to the first and second embodiments, a channel width is limited in comparison with the entirety of a unit Y repeated in a vertical direction. Therefore, there are exhibited effects such as low ON-resistance, suppression of short-circuit current, prevention of latch-up phenomenon, and the like. Furthermore, since emitter regions are arranged intermittently, a contact area of a P emitter region and an emitter electrode 309 is limited. Therefore, an escape path for holes to escape to an emitter electrode 309 under ON state is lessened. The lessened escape path contributes to maintain hole concentration under ON state and to further lower ON-resistance. Thereby, a channel width X can be narrowed within a region that does not make ON-resistance rise. This contributes to further lowering of short-circuit current, unification of current in devices and prevention of device destruction.

[Fourth Embodiment]

Figure 19:
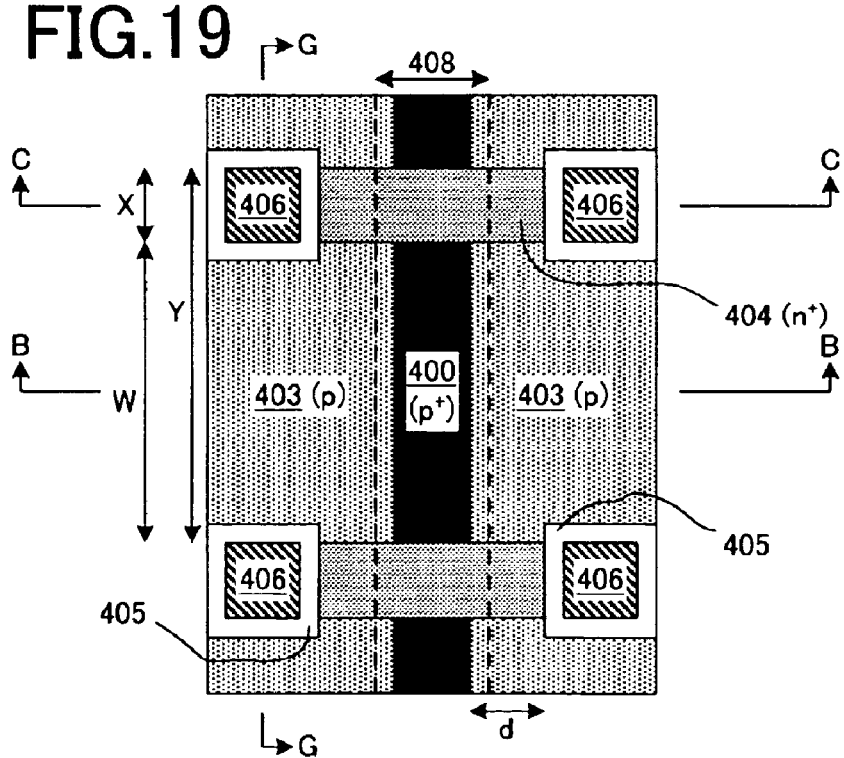
FIG. 19 is a plane sectional view (a portion A—A) showing structure of a field-effect-type semiconductor device directed to a fourth embodiment.
Figure 20:
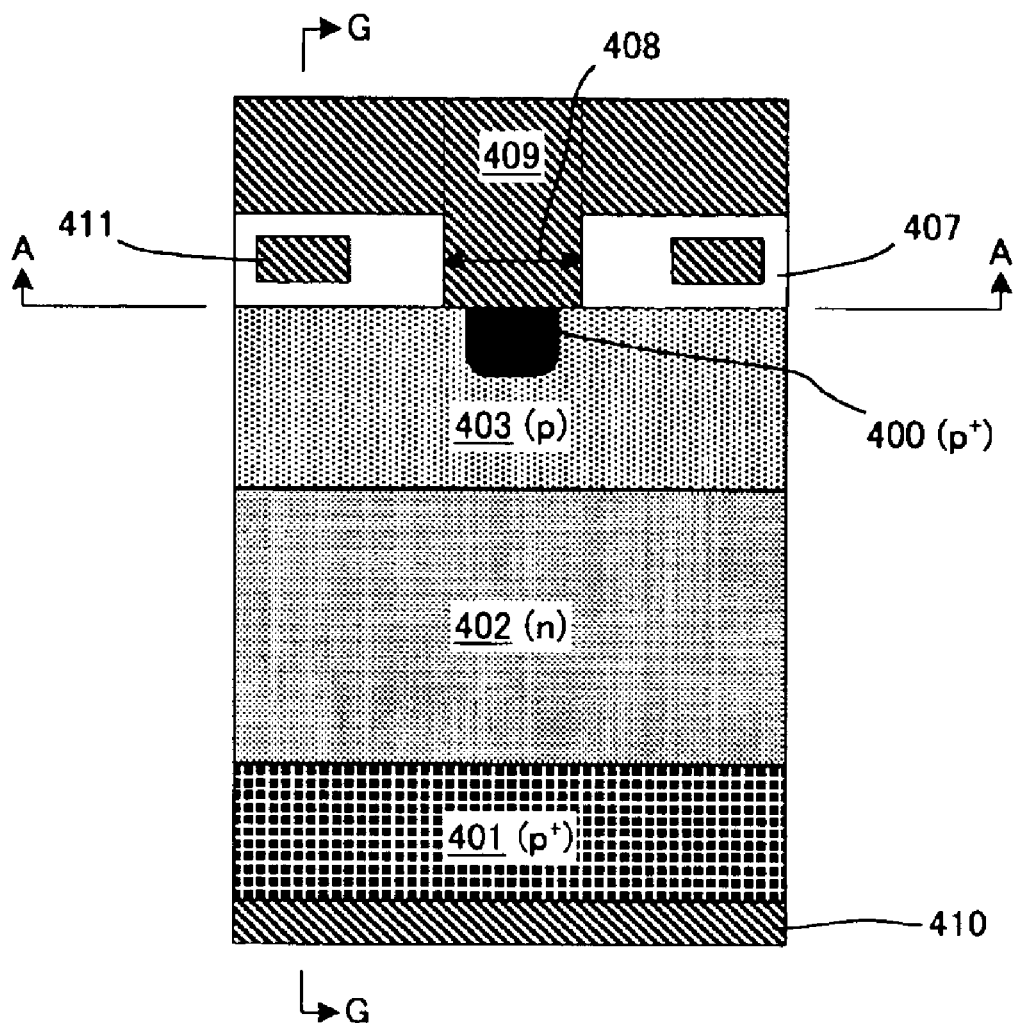
FIG. 20 is an elevation sectional view (a portion B—B) showing structure of the field-effect-type semiconductor device directed to the fourth embodiment.
Figure 21:
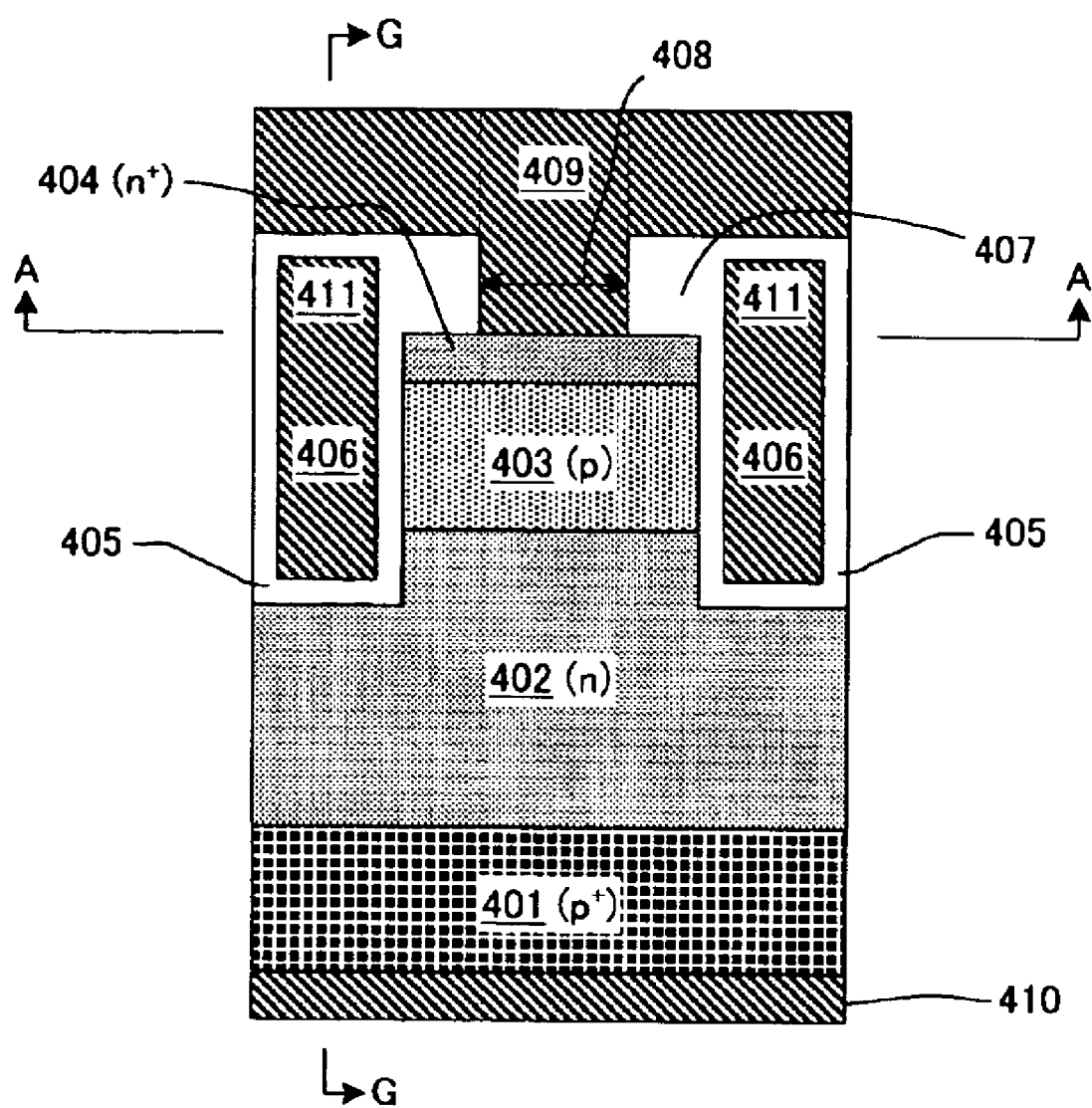
FIG. 21 is an elevation sectional view (a portion C—C) showing structure of the field-effect-type semiconductor device directed to the fourth embodiment.
Figure 22:
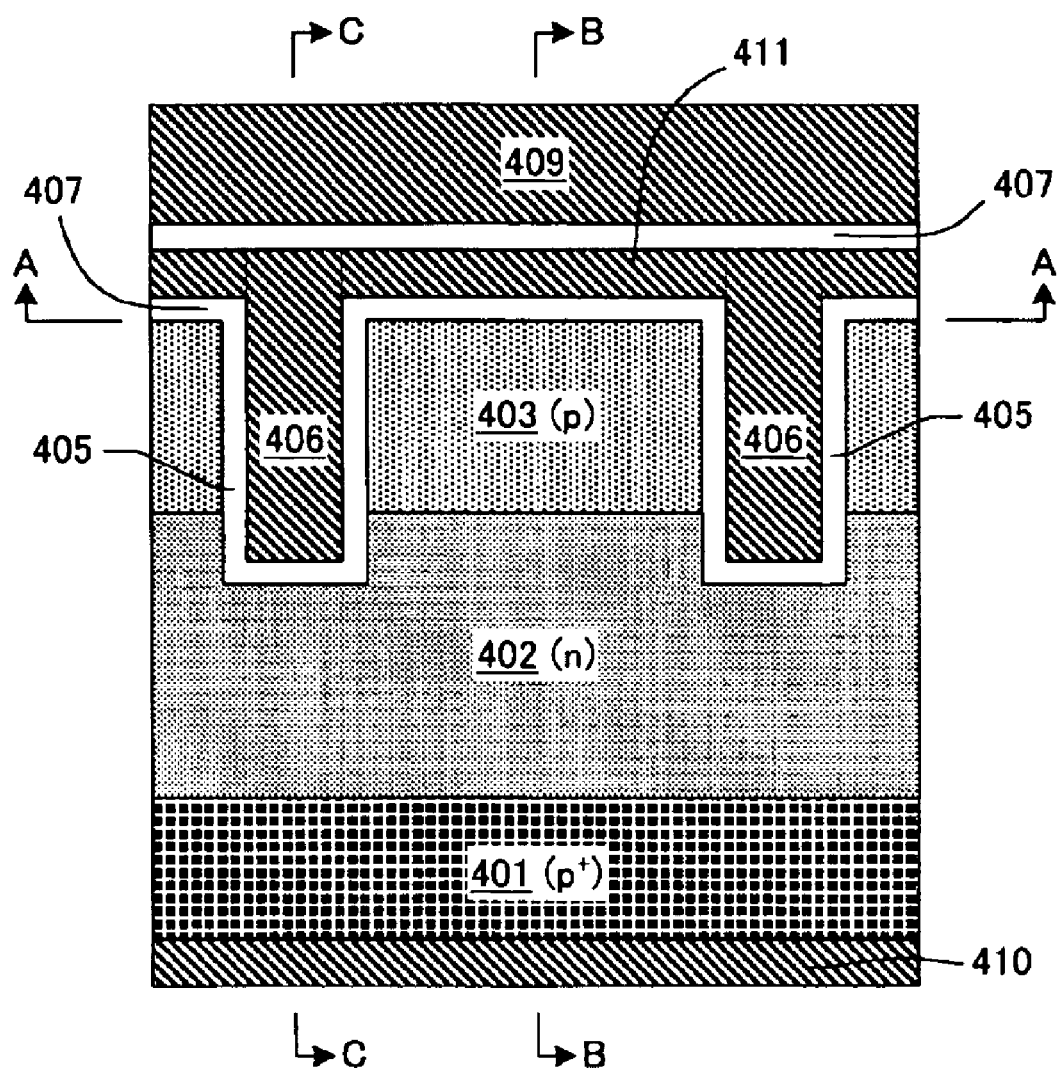
FIG. 22 is an elevation sectional view (a portion G—G) showing structure of the field-effect-type semiconductor device directed to the fourth embodiment.

FIG. 19 through FIG. 22 show structure of a field-effect-type semiconductor device directed to a fourth embodiment. FIG. 20 shows a sectional view of a portion B—B in FIG. 19. FIG. 21 shows a sectional view of a portion C—C in FIG. 19. FIG. 22 shows a sectional view of a portion G—G in FIG. 19 through FIG. 21. FIG. 19 shows a sectional view of a portion A—A in FIG. 20 through FIG. 22. The field-effect-type semiconductor device of this embodiment is common to the first through third embodiments in terms of being trench-gate type. Furthermore, structure of an emitter portion in a contact opening 408 is same as the first embodiment and structure of its collector portion is same as the first through embodiments.

In the field-effect-type semiconductor device of the present embodiment, gate electrodes 406 are insularly arranged and in this point, the present embodiment differs from the first through third embodiments in which gate electrodes are linearly arranged. In the field-effect-type semiconductor device of the present embodiment, gate electrodes are generally replaced with insularly arranged gate electrodes 406 instead of linearly arranged gate electrodes 106 in the first embodiment, and all of the surplus portions assumed to be provided for gate electrode portion in the first through third embodiments are used for P channel regions 403. It should be noted that, as shown in FIG. 20 and FIG. 22, a gate wiring 411 for connecting each gate electrode 406 is provided in an interlayer dielectric 407 on a portion G—G in FIG. 19.

In the field-effect-type semiconductor device of this embodiment, a ratio X/W: a width W, namely, a vertical directional width of the P emitter region in FIG. 19 (i.e., a channel width); and a width X, namely, a vertical direction width of the N$^+$ emitter region 404 (i.e., an interval between adjoining channels); is preferably between ¹⁄₁₀ and ½. That is, in case the ratio X/W lowers ¹⁄₁₀, i.e., in case the N$^+$ emitter region 404 is too small, ON-resistance is high. On the contrary, in case the ratio X/W surpasses ½, short-circuit current becomes large, which is not preferable. An optimum value of X/W is around ⅕. Furthermore, it is preferable that the width X of the N$^+$ emitter region 404 is 20 μm or narrower. That is, in case it is too wide, latch-up phenomenon is likely to occur.

Except for difference of a mask pattern for trench-gate structure for forming a gate electrode 406, manufacturing process of the field-effect-type semiconductor device of the present embodiment is similar to the first embodiment. In this embodiment also, current between an emitter electrode 409 and a collector 410 is controlled by applying voltage to gate electrodes 406.

Each gate electrode 406 has a generally square-shaped cross section, in FIG. 19. Length of a side of each gate electrode 406 in FIG. 19 is almost same as a width X of an N$^+$ emitter region 404. The surrounding of a gate dielectric 405 which is surrounding a gate electrode 406 is occupied by an N$^+$ emitter region 404 and a P channel region 403.

In the field-effect-type semiconductor device of the present embodiment also, current between an emitter electrode 409 and a collector electrode 410 is controlled by applying voltage to the gate electrodes 406. In addition to effects obtained with the first embodiment, the field-effect-type semiconductor device of this embodiment obtains the following peculiar effects as its gate electrodes 406 are insularly arranged. That is, a gate area (an area of a gate electrode in FIG. 1, FIG. 19 and the like) can be made small without changing its channel width X, in comparison with the aspects of the first embodiment. Therefore, there can be obtained a merit that gate capacity is small and switching-speed is high. Furthermore, the aspect that a gate area is small is an advantageous factor in terms of efficiency percentage in manufacturing and low cost performance. In manufacturing process of gate electrode, efficiency percentage is likely to lower due to mingling of foreign particles and the like, in comparison with other manufacturing process. Therefore, shrinkage of gate area can suppress lowering of efficiency percentage. Furthermore, since portions other than a portion that faces to an N$^+$ emitter region 404 do not contribute to formation of a channel, it is not necessary to provide a gate electrode 406 on such portions.

[Fifth Embodiment]

Figure 23:
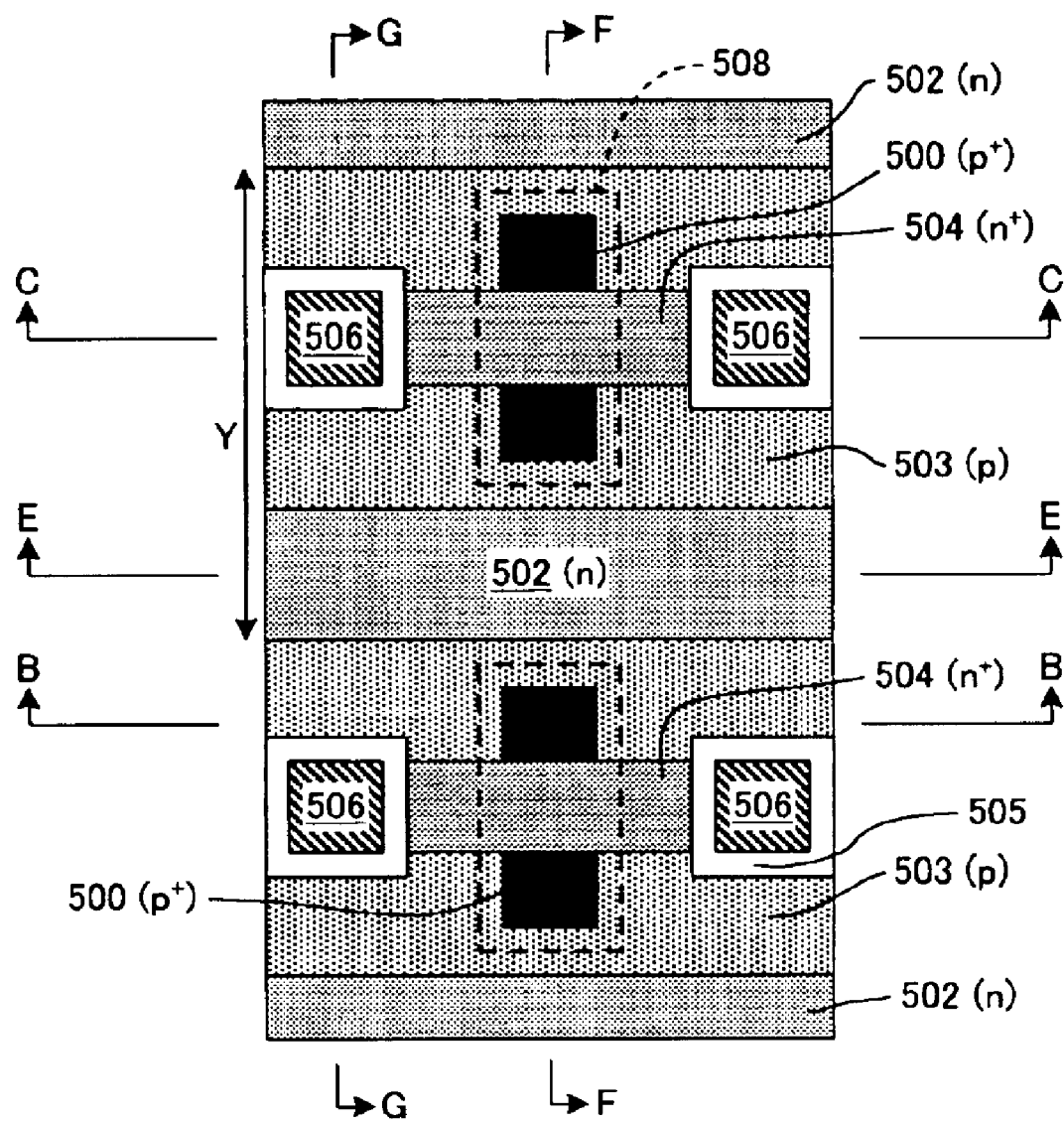
FIG. 23 is a plane sectional view (a portion A—A) showing structure of a field-effect-type semiconductor device directed to a fifth embodiment.
Figure 24:
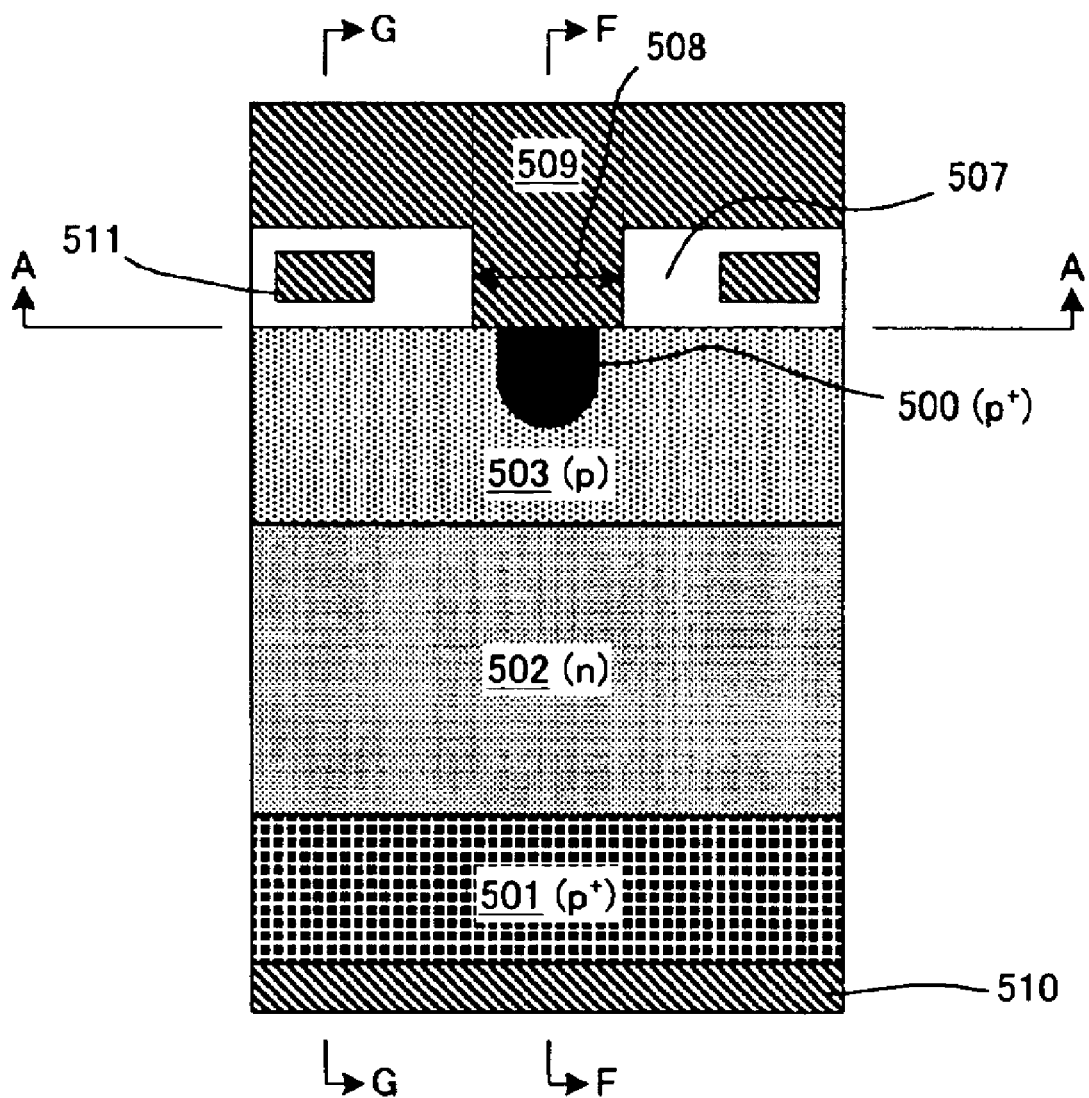
FIG. 24 is an elevation sectional view (a portion B—B) showing structure of the field-effect-type semiconductor device directed to the fifth embodiment.
Figure 25:
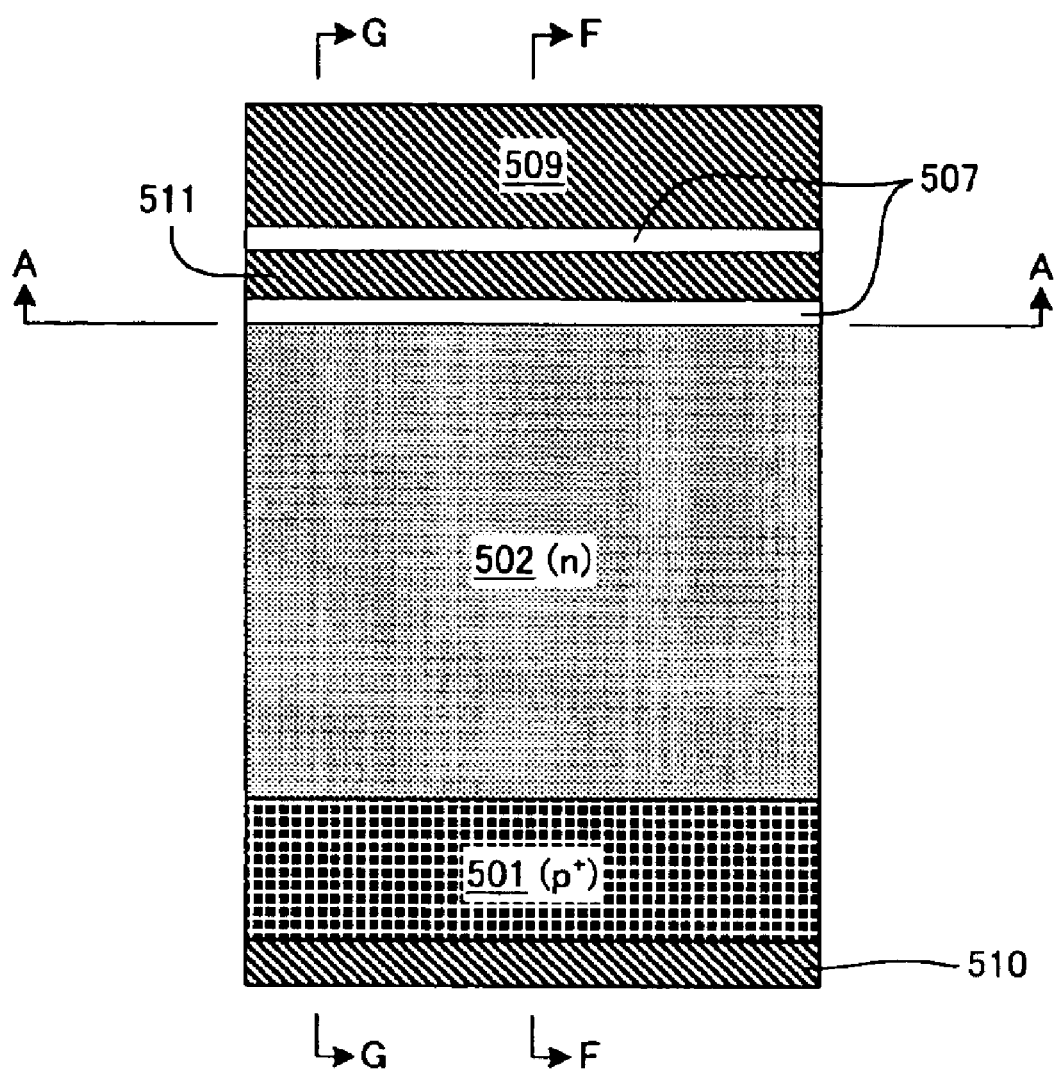
FIG. 25 is an elevation sectional view (a portion E—E) showing structure of the field-effect-type semiconductor device directed to the fifth embodiment.
Figure 26:
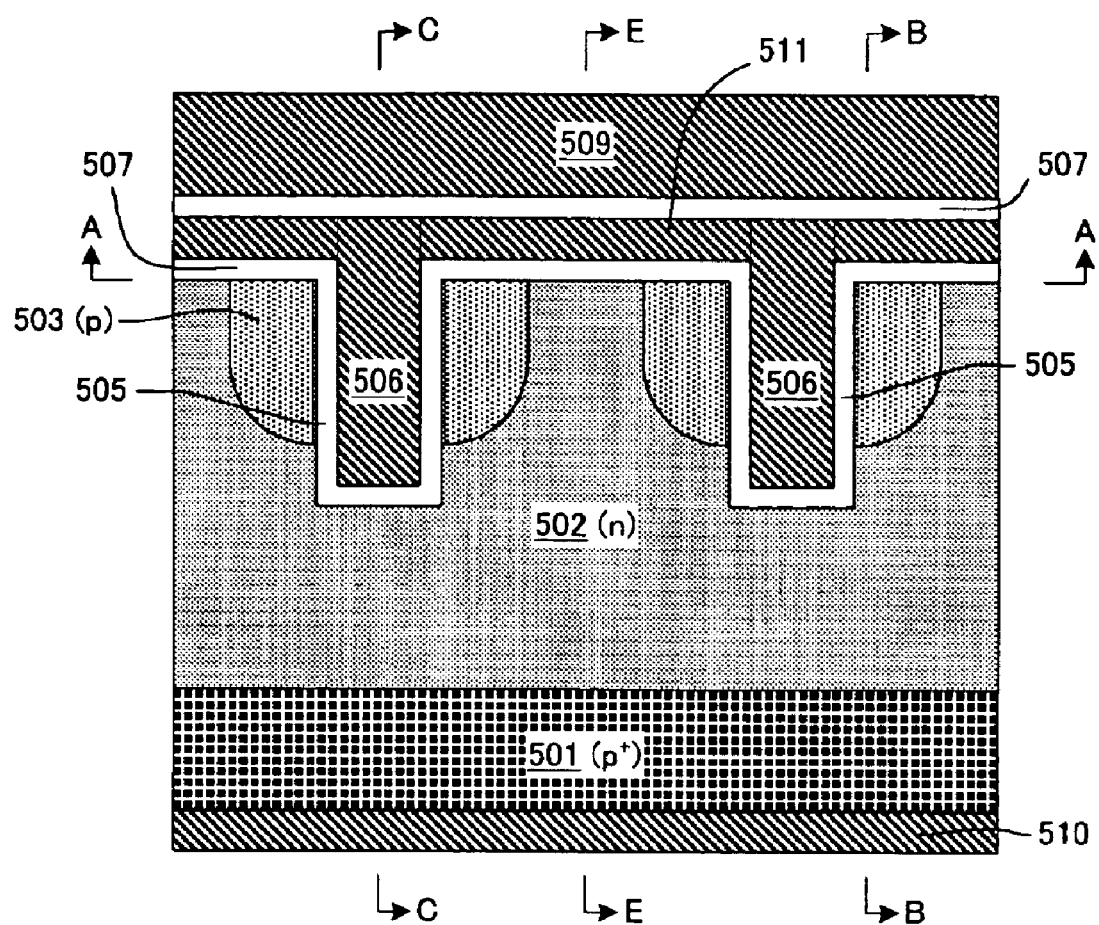
FIG. 26 is an elevation sectional view (a portion G—G) showing structure of the field-effect-type semiconductor device directed to the fifth embodiment.

FIG. 23 through FIG. 26 show structure of a field-effect-type semiconductor device directed to a fifth embodiment. FIG. 24 shows a sectional view of a portion B—B in FIG. 23. FIG. 25 shows a sectional view of a portion E—E in FIG. 23. FIG. 26 shows a sectional view of a portion G—G in FIG. 23 through FIG. 25. FIG. 23 shows a sectional view of a portion A—A in FIG. 24 through FIG. 26. Furthermore, the sectional view of the portion C—C in FIG. 23 is substantially same as FIG. 21 directed to the fourth embodiment of which numberings are changed from "4" to "5". Still further, the sectional view of the portion F—F in FIG. 23 is substantially same as FIG. 18 directed to the third embodiment of which numberings are changed from "3" to "5". Hereinafter, numberings should be interpreted like that when FIG. 18 and FIG. 21 are referred in this embodiment.

The field-effect-type semiconductor device of this embodiment is common to the first through fourth embodiments in terms of being trench-gate type. Furthermore, the structure of its emitter portion at a contact opening 508 is same as the third embodiment. Furthermore, the structure of its collector portion is same as the first through fourth embodiments. The field-effect-type semiconductor device of this embodiment is equivalent to a field-effect-type semiconductor device of the third embodiment to which the following structure is applied: gate electrodes 506 are insularly arranged like the forth embodiment; and a surplus portion is used for either a P channel region 503 or an N drift region 502.

Accordingly, in addition to effects obtained with the first embodiment, the field-effect-type semiconductor device of this embodiment obtains the following effects: ON-resistance is lowered by arranging emitter regions intermittently (effect obtained with the third embodiment) and switching speed is enforced by insularly arrange gate electrodes 506 (effect obtained with the fourth embodiment).

[Variants]

So far described first through fifth embodiments are various variations of emitter-side structure (gate electrode, P$^+$ emitter region, emitter electrode, and the like) of the inventive the field-effect-type semiconductor device. There are also variations of collector-side structure as shown in FIG. 27 through FIG. 29.

Figure 27:
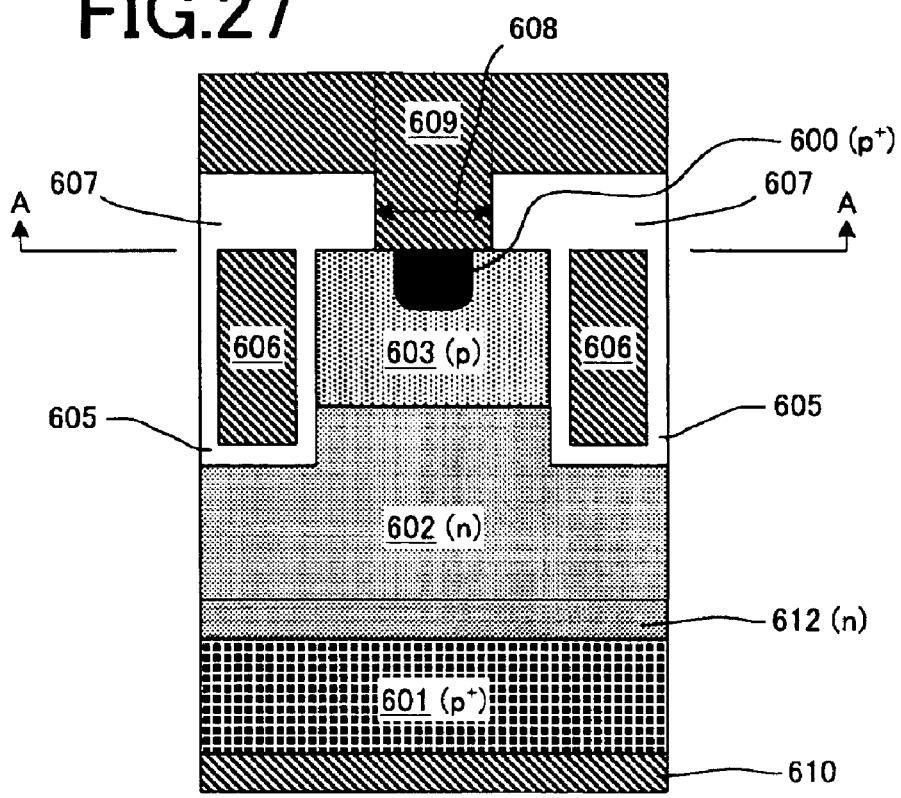
FIG. 27 is an elevation sectional view (a portion B—B) showing structure of a field-effect-type semiconductor device directed to a first variant.

FIG. 27 shows a variant of a field-effect-type semiconductor device directed to the first embodiment changed into punch-through type. FIG. 27 is a cross sectional view corresponding to FIG. 2 directed to the first embodiment. This field-effect-type semiconductor device has an N buffer region 612 between a P+ collector region 601 and an N drift region 602. Donor concentration of the N buffer region 612 is higher than that of the N drift region 602. For manufacturing this field-effect-type semiconductor device, a P+ silicon wafer is used as a start substrate. High concentration of N-type silicon layer and low concentration of N-type silicon layer are formed in turn on a surface of the start substrate by epitaxial growth. That is, P+ silicon on the wafer is formed as a P+ collector region 601, high concentration of N-type silicon layer as an N buffer region 612, and low concentration of N-type silicon layer as an N drift region 602. Manufacturing process thereafter is same as the first embodiment. Alternatively, low concentration of N-type silicon wafer (N drift region 602) can be a start substrate and an N buffer region 612 and a P+ collector region 601 can be formed by injecting and diffusing donor and acceptor from a bottom face of the substrate.

Figure 28:
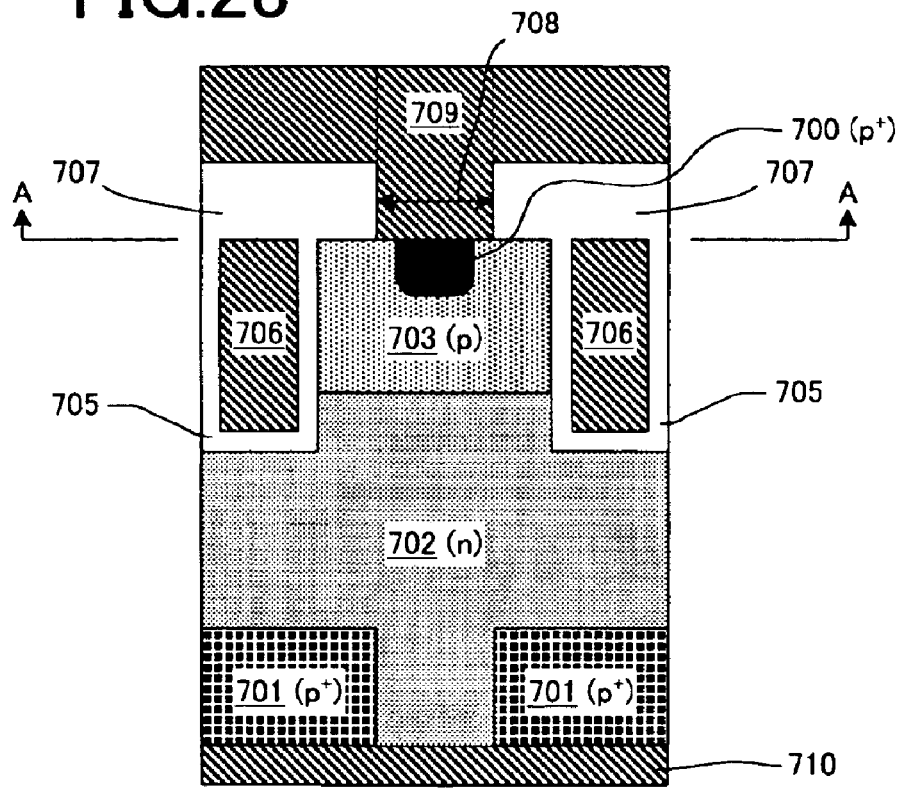
FIG. 28 is an elevation sectional view (a portion B—B) showing structure of a field-effect-type semiconductor device directed to a second variant.

FIG. 28 shows a variant of a field-effect-type semiconductor device directed to the first embodiment changed into collector-short type. FIG. 28 is a cross sectional view corresponding to FIG. 2 directed to the first embodiment. In this field-effect-type semiconductor device, a P+ collector region 701 is not formed on the entirety of a collector electrode 710 but is formed on a part of the collector electrode 710. Where a P+ collector region 701 is not provided, N drift region 702 and collector electrode 710 are in contact directly. For manufacturing this field-effect-type semiconductor device, an N silicon wafer is used as a start substrate, and acceptor is injected and diffused from a bottom face of the substrate through pattern mask. That is, N-type silicon of wafer is used as an N drift region 702, and a portion to which acceptor is injected is used as a P+ collector region 701. Manufacturing process thereafter is same as the first embodiment.

Figure 29:
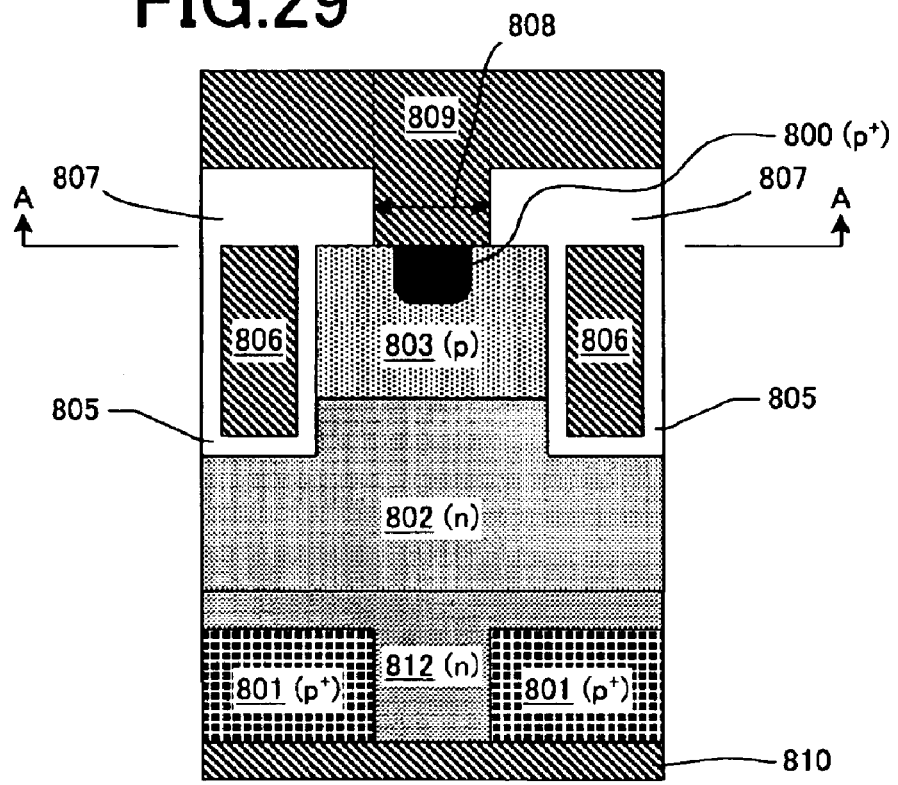
FIG. 29 is an elevation sectional view (a portion B—B) showing structure of a field-effect-type semiconductor device directed to a third variant.
Figure 30:
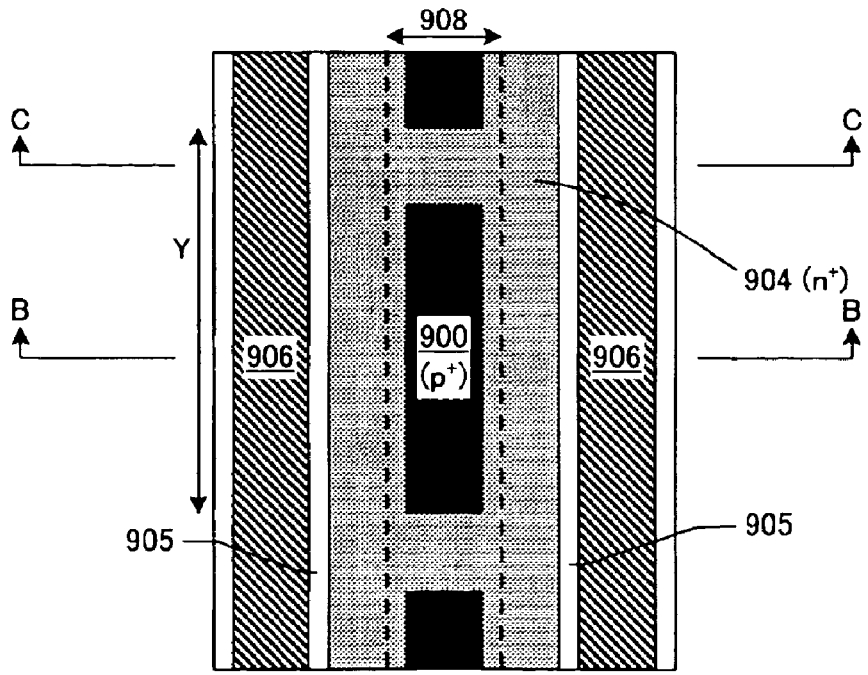
FIG. 30 is a plane sectional view (a portion A—A) showing structure of a conventional field-effect-type semiconductor device.
Figure 31:
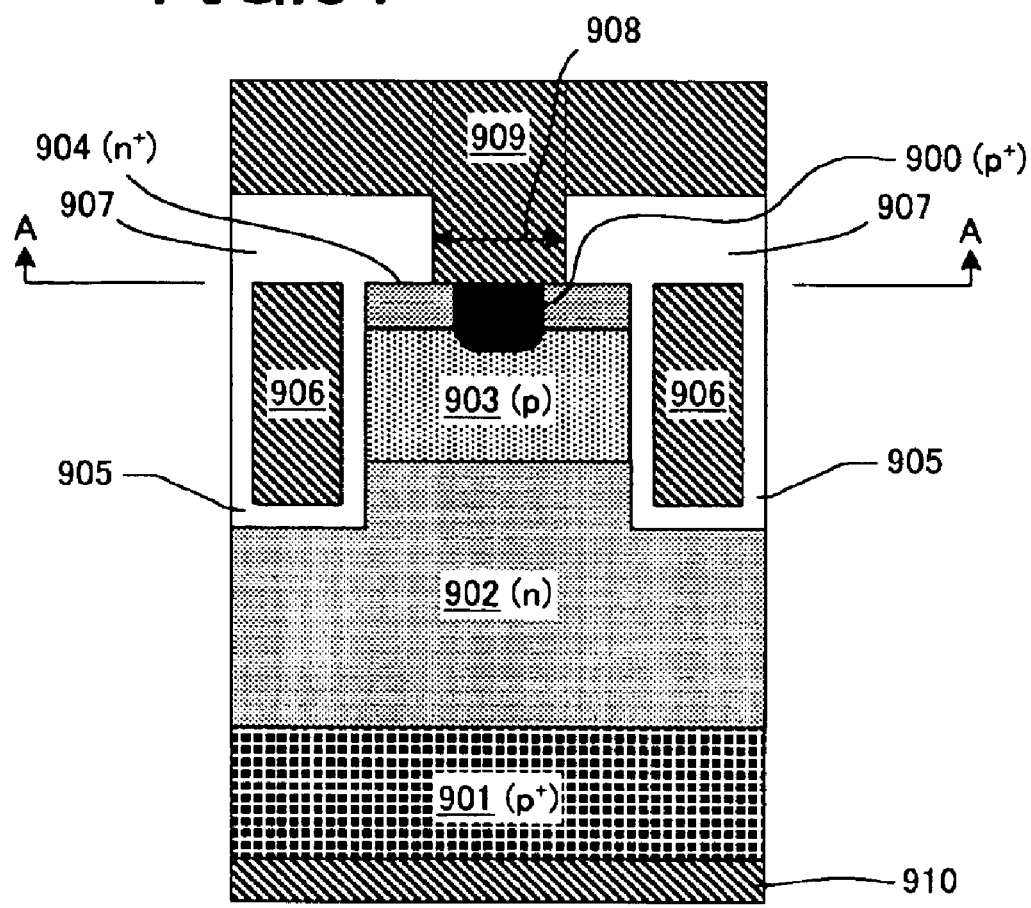
FIG. 31 is a plane sectional view (a portion B—B) showing structure of a conventional field-effect-type semiconductor device.

FIG. 29 shows another variant of collector-short type. FIG. 29 is a cross sectional view corresponding to FIG. 2 directed to the first embodiment. In this field-effect-type semiconductor device, a P+ collector region 801 is not formed on the entirety of a collector electrode 810 but is formed on a part of the collector electrode 810. An N buffer region 812 is arranged between a P+ collector region 801 and an N drift region 802. Donor concentration of an N buffer 812 is higher than that of an N drift region 802. An N buffer region 812 is in contact with a collector electrode 810 directly at a portion without a P+ collector region 801. That is, this field-effect-type semiconductor device has characteristics of both punch-through type in FIG. 27 and collector-short type in FIG. 28. For manufacturing this field-effect-type semiconductor device, an N-type silicon wafer is used as a start substrate, and donor is injected and diffused from a bottom surface of the substrate, thereby to form high concentration of N-type silicon layer. After that, acceptor is injected and diffused from the bottom face through pattern mask, thereby to partially form a P-type silicon layer. That is, N-type silicon of wafer is used as an N drift region 802, high concentration of N-type silicon layer as an N buffer region 812, and P-type silicon layer as a P+ collector region 801. Manufacturing process thereafter is same as the first embodiment.

Needless to say, variations as shown in FIG. 27 through FIG. 29 can be applied to the field-effect-type semiconductor devices of the second through fifth embodiments.

As described, the field-effect-type semiconductor devices of those embodiments and variations have structure that gate electrodes (106, etc.) go through a P channel region (103, etc.). In such structure, an emitter region is constituted by P emitter region and an N+ emitter region (104, etc.) and its P emitter region is constituted by P+ emitter region (100, etc.) and a P channel region (103, etc.). A channel width W, a width of a P channel region (103, etc.) facing to gate electrodes (106, etc.), is set to a range between ⅒ and ½ against an interval X, an interval between adjoining channels. Therefore, ON-resistance is sufficiently low under normal operation state while short-circuit current is not significantly large. Accordingly, device destruction does not occur even though short-circuit current flows.

Furthermore, a contact opening (108, etc.) is formed so that an N+ emitter region (104, etc.), a P+ emitter region (100, etc.), and a P channel region (103, etc.) are connected to an emitter electrode (109, etc.). Therefore, a contact area of a P+ emitter region (100, etc.) and an emitter electrode (109, etc.) is limited and amount of holes escaping to emitter electrode (109, etc.) under ON state is limited, as well. Furthermore, since a channel is formed, inconstancy of electrons in device does not occur. Those aspects also contribute to lowering of ON-resistance and prevention of latch-up phenomenon.

Furthermore, in the second embodiment, gate electrodes 206 are linearly formed, and an N+ emitter region 204 and a P+ emitter region 200 are arranged in orthogonal to the gate electrodes 206. Thereby, ON-resistance and short-circuit current can be set separately. The second embodiment has also another advantage that downsizing in a horizontal direction in the drawings can be made readily. Furthermore, in the third embodiment, N drift regions can be arranged on portions without P emitter regions that are provided intermittently, thereby a contact area of a P emitter region and an emitter electrode 309 can be limited and ON-resistance can be further lowered. Furthermore, in the fourth and fifth embodiments, gate electrodes 406 and 506 are insularly arranged, whereby a gate area can be shrunken while a certain extent of channel width X is secured. Thereby, high-speed operation and enhancement of yield rate can be achieved.

The above described embodiments are provided for mere illustrative purpose, and the present invention is not limited thereto. Of course, various modifications or variations can occur without departing the spirit of the invention.

For example, donor concentration within an N drift region (102, etc.) may not be uniform. The N buffer regions 612 and 812 shown in FIG. 27 and FIG. 29, respectively, are examples of it. That is, in the N drift regions 602 and 802 of these variations, donor concentrations within areas which are near to the P+ collector regions 601 and 801 are made high. These are N buffer regions 612 and 812. Furthermore, the present invention is applicable to not only an IGBT but also other types of field-effect-type semiconductor devices such as MOS control thyrister, and the like. Material of a semiconductor itself is not restricted to silicon but other kind of material such as SiC, III-V compound and the like can be used. Furthermore, material of a dielectric is not restricted to oxide film but nitride film or composite film can be used. Material of a gate electrode (106, etc.) may be P-type semiconductor or metal. Structure of a gate electrode is not restricted to trench structure but planer-type and concave-type are applicable. Furthermore, P-type and N-type are replaceable to each other. Furthermore, with respect to the fourth and fifth embodiments, plane shapes of gate electrodes (406, 506) is not restricted to quadrangle, but circle, ellipse, and other polygon are possible.

As apparent from the above description, according to the present invention, there is provided a field-effect-type semiconductor device that can let low ON-resistance and non-excessive short-circuit current go together by effectively using its channel width and prevents element from destruction.

What is claimed is:

1. A field-effect-type semiconductor device comprising:
a channel region of a first conduction-type semiconductor;
a first-conduction-type emitter region being in contact with the channel region, and being a first conduction type semiconductor with higher concentration than that of the channel region;
a gate electrode penetrating the channel region, and insulated from the channel region and the first-conduction-type emitter region;
second-conduction-type emitter regions being insulated from the gate electrode and in contact with the channel region and the first-conduction-type emitter region, the second-conduction-type emitter regions being second conduction-type semiconductors;
said second-conduction-type emitter regions and said channel region being arranged alternately and discretely at a surface level; and
an emitter electrode being in contact with the channel region and with the first-conduction-type emitter region;
wherein an effective channel width, which is a width of a facing portion of a second-conduction-type emitter region and the gate electrode at the surface level is smaller than a whole width of the gate electrode.

2. A field-effect-type semiconductor device according to claim 1,
wherein the second-conduction-type emitter regions are in contact with the channel region and the emitter electrode, and
the gate electrode faces the second-conduction-type emitter region, the channel region and a contact portion of those regions.

3. A field-effect-type semiconductor device according to claim 1, wherein gate electrodes are formed linearly, and channel regions are formed discretely between adjoining gate electrodes at surface level.

4. A field-effect-type semiconductor device according to claim 2, wherein gate electrodes are formed linearly, and channel regions are formed discretely between adjoining gate electrodes at surface level.

5. A field-effect-type semiconductor device according to claim 3, wherein a width of a channel section in which the second-conduction-type emitter region and the channel region are in contact with each other at a face facing the gate electrode is narrower than an interval between adjoining channel sections.

6. A field-effect-type semiconductor device according to claim 4, wherein a width of a channel section in which the second-conduction-type emitter region and the channel region are in contact with each other at a face facing the gate electrode is narrower than an interval between adjoining channel sections.

7. A field-effect-type semiconductor device according to claim 2, wherein gate electrodes are formed linearly, second-conduction-type emitter regions are formed discretely between adjoining gate electrodes, and each second-conduction-type emitter region is facing adjoining two gate electrodes.

8. A field-effect-type semiconductor device according to claim 7, wherein the first-conduction-type emitter region is formed between adjoining two second-conduction-type emitter regions with its width being narrower than a width of the emitter electrode.

9. A field-effect-type semiconductor device according to claim 8, wherein, in an area at surface level between two adjoining second-conduction-type emitter regions, a portion other than the first-conduction-type emitter region is occupied by the channel region.

10. A field-effect-type semiconductor device according to claim 7, wherein first-conduction-type emitter regions are formed discretely between adjoining gate electrodes, and
each first-conduction-type emitter region is facing adjoining two gate electrodes.

11. A field-effect-type semiconductor device according to claim 10, wherein an area at surface level between a second-conduction-type emitter region and a first-conduction-type emitter region that adjoin to each other is occupied by the channel region.

12. A field-effect-type semiconductor device according to claim 7 further comprising a drift region arranged below the channel region, the drift region being a second conduction-type semiconductor,
wherein a part of an area at surface level surrounded by adjoining second-conduction-type emitter regions and adjoining gate electrodes is occupied by the drift region.

13. A field-effect-type semiconductor device according to claim 8 further comprising a drift region arranged below the channel region, the drift region being a second conduction-type semiconductor,
wherein a part of an area at surface level surrounded by adjoining second-conduction-type emitter regions and adjoining gate electrodes is occupied by the drift region.

14. A field-effect-type semiconductor device according to claim 12, wherein pluralities of contact opening in which the emitter electrode is in contact with the channel region, the first-conduction-type emitter region and the second-conduction-type emitter region are arranged discretely avoiding the drift region.

15. A field-effect-type semiconductor device according to claim 13, wherein pluralities of contact opening in which the emitter electrode is in contact with the channel region, the first-conduction-type emitter region and the second-conduction-type emitter region are arranged discretely avoiding the drift region.

16. A field-effect-type semiconductor device according to claim 2, wherein
gate electrodes are formed insularly,
the second-conduction-type emitter region is arranged between adjoining gate electrodes, and
areas at surface level surrounding gate electrodes are occupied by the channel region except for a part that is occupied by the second-conduction-type emitter region.

17. A field-effect-type semiconductor device according to claim 5, wherein
gate electrodes are formed insularly,
the second-conduction-type emitter region is arranged between adjoining gate electrodes, and areas at surface level surrounding gate electrodes are occupied by the channel region except for a part that is occupied by the second-conduction-type emitter region.

18. A field-effect-type semiconductor device according to claim 16, wherein the first-conduction-type emitter region is formed between adjoining two second-conduction-type emitter regions with its width being narrower than a width of the emitter electrode.

19. A field-effect-type semiconductor device according to claim 17, wherein the first-conduction-type emitter region is formed between adjoining two second-conduction-type emitter regions with its width being narrower than a width of the emitter electrode.

20. A field-effect-type semiconductor device according to claim 16 further comprising a drift region arranged below the channel region, the drift region being a second conduction-type semiconductor, wherein a part of an area at surface level surrounded by adjoining second-conduction-type emitter regions and adjoining gate electrodes is occupied by the drift region, and pluralities of contact opening in which the emitter electrode is in contact with the channel region, the first-conduction-type emitter region and the second-conduction-type emitter region are arranged discretely avoiding the drift region.

* * * * *